United States Patent
Yi et al.

(10) Patent No.: US 8,891,324 B2
(45) Date of Patent: Nov. 18, 2014

(54) MEMORY DEVICE FROM WHICH DUMMY EDGE MEMORY BLOCK IS REMOVED

(71) Applicants: Chul-woo Yi, Hwaseong-si (KR);
Seong-jin Jang, Seongnam-si (KR);
Jin-seok Kwak, Hwaseong-si (KR);
Tai-young Ko, Seongnam-si (KR);
Joung-yeal Kim, Yongin-si (KR);
Sang-yun Kim, Hwaseong-si (KR);
Sang-kyun Park, Hwaseong-si (KR);
Jung-bae Lee, Yongin-si (KR)

(72) Inventors: Chul-woo Yi, Hwaseong-si (KR);
Seong-jin Jang, Seongnam-si (KR);
Jin-seok Kwak, Hwaseong-si (KR);
Tai-young Ko, Seongnam-si (KR);
Joung-yeal Kim, Yongin-si (KR);
Sang-yun Kim, Hwaseong-si (KR);
Sang-kyun Park, Hwaseong-si (KR);
Jung-bae Lee, Yongin-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 13/915,338

(22) Filed: Jun. 11, 2013

(65) Prior Publication Data
US 2013/0272047 A1    Oct. 17, 2013

Related U.S. Application Data

(62) Division of application No. 13/023,738, filed on Feb. 9, 2011, now Pat. No. 8,482,951.

(30) Foreign Application Priority Data

Feb. 9, 2010   (KR) .................. 10-2010-0012027
Mar. 23, 2010  (KR) .................. 10-2010-0025877

(51) Int. Cl.
*G11C 7/00* (2006.01)
(Continued)

(52) U.S. Cl.
CPC .............. *G11C 5/063* (2013.01); *G11C 1/4097* (2013.01); *G11C 7/062* (2013.01);
(Continued)

(58) Field of Classification Search
CPC . G11C 5/063; G11C 11/4097; G11C 11/4091
USPC ...................... 365/202, 51, 63, 203, 226, 207
See application file for complete search history.

(56) References Cited

U.S. PATENT DOCUMENTS 610,630 A * 9/1898 Miller .......................... 425/398
5,515,315 A * 5/1996 Uda et al. ..................... 365/174
(Continued)

FOREIGN PATENT DOCUMENTS

CN        1218960 A      6/1999
CN      101241749 A      8/2008
(Continued)

OTHER PUBLICATIONS

Chinese Office Action Issued July 1, 2014 in Related Chinese Patent Application No. 201110035035.5.

*Primary Examiner* — Viet Q Nguyen
(74) *Attorney, Agent, or Firm* — Volentine & Whitt, PLLC

(57) ABSTRACT

A semiconductor memory device having an open bitline memory structure from which an edge dummy memory block is removed, the semiconductor memory device includes a memory block, an edge sense amplification block including a first sense amplifier having a first bitline, a first complementary bitline, and a first amplification circuit comprising a first transistor having a first size, a central sense amplification block including a second sense amplifier having a second bitline, a second complementary bitline, and a second amplification circuit comprising a second transistor having a second size different from the first size, a capacitor block electrically connected to the edge sense amplification block.

11 Claims, 25 Drawing Sheets

(51) Int. Cl.
*G11C 5/06* (2006.01)
*G11C 7/06* (2006.01)
*H01L 27/02* (2006.01)
*H01L 27/105* (2006.01)
*G11C 7/18* (2006.01)
*G11C 11/4091* (2006.01)
*H01L 27/108* (2006.01)

(52) U.S. Cl.
CPC ............ *G11C 7/065* (2013.01); *H01L 27/0207* (2013.01); *H01L 27/105* (2013.01); *G11C 7/18* (2013.01); *H01L 27/10897* (2013.01); *H01L 27/10885* (2013.01); *G11C 11/4091* (2013.01)
USPC ............. 365/202; 365/63; 365/207; 365/203; 365/226; 365/51

(56) References Cited

U.S. PATENT DOCUMENTS

| | | | |
|---|---|---|---|
| 5,594,701 A * | 1/1997 | Asaka et al. | 365/230.03 |
| 5,602,772 A * | 2/1997 | Nakano et al. | 365/51 |
| 5,850,366 A | 12/1998 | Coleman, Jr. | |
| 5,867,440 A * | 2/1999 | Hidaka | 365/226 |
| 5,966,315 A | 10/1999 | Muller et al. | |
| 5,999,471 A * | 12/1999 | Choi | 365/222 |
| 6,043,562 A * | 3/2000 | Keeth | 257/776 |
| 6,147,925 A * | 11/2000 | Tomishima et al. | 365/230.03 |
| 6,331,791 B1 * | 12/2001 | Huang | 326/98 |
| 6,356,474 B1 | 3/2002 | Bissey et al. | |
| 6,370,054 B1 * | 4/2002 | Fujisawa et al. | 365/63 |
| 6,392,942 B2 | 5/2002 | Noda et al. | |
| 6,473,350 B2 * | 10/2002 | Lee | 365/207 |
| 6,480,434 B1 * | 11/2002 | Lee | 365/203 |
| 6,574,135 B1 | 6/2003 | Komatsuzaki | |
| 6,603,688 B2 * | 8/2003 | Hasegawa et al. | 365/200 |
| 6,711,050 B2 | 3/2004 | Sadakata | |
| 7,177,216 B2 | 2/2007 | Suh et al. | |
| 7,193,884 B2 | 3/2007 | Sekiguchi et al. | |
| 7,193,925 B2 * | 3/2007 | Hong | 365/230.06 |
| 7,283,412 B2 * | 10/2007 | Do | 365/205 |
| 7,570,529 B2 | 8/2009 | Kim et al. | |
| 7,649,760 B2 | 1/2010 | Hong et al. | |
| 7,652,942 B2 | 1/2010 | Kim et al. | |
| 7,656,732 B2 | 2/2010 | Kuroda | |
| 7,659,769 B2 * | 2/2010 | Nakaya et al. | 327/534 |
| 7,903,449 B2 | 3/2011 | Kajigaya et al. | |
| 7,948,784 B2 | 5/2011 | Kajigaya | |
| 7,948,785 B2 | 5/2011 | Choi | |
| 8,184,471 B2 | 5/2012 | Woo et al. | |
| 2003/0231525 A1 | 12/2003 | Mine | |
| 2009/0323390 A1 | 12/2009 | Takizawa et al. | |

FOREIGN PATENT DOCUMENTS

| | | |
|---|---|---|
| JP | 05041081 A | 2/1993 |
| JP | 09082084 A | 3/1997 |
| JP | 10055673 A | 2/1998 |
| JP | 2004062997 A | 2/2004 |

\* cited by examiner (a)

(b)

(a)

(b)

MEMORY DEVICE FROM WHICH DUMMY EDGE MEMORY BLOCK IS REMOVED

CROSS-REFERENCE TO RELATED APPLICATIONS

This is a Divisional of application Ser. No. 13/023,738, filed Feb. 9, 2011, which is incorporated herein by reference in its entirety.

BACKGROUND OF THE INVENTION

Embodiments of the present inventive concept relate to semiconductor memory devices. More particularly, embodiments of the inventive concept relate to semiconductor memory devices from which a dummy edge memory block is removed.

Semiconductor memory devices may be classified or identified according memory cell type and/or a number of layout or structure features. Some semiconductor memory devices are classified or identified according to the type (or structure) of their constituent bitline sense amplifier (BLSA). For example, semiconductor memory devices may be designated as 8F2, 6F2, etc., in accordance with the structure of their constituent memory cells, and may also be classified as an open BLSA type or a folded BLSA type according to the structure of their constituent BLSA.

The process of increasing the integration density of a semiconductor device typically requires a reduction in respective component sizes and/or a more densely laid out arrangement of components. For example, in the context of memory cell type, the integration density of a 6F2 type semiconductor memory device is greater than that of a 8F2 type semiconductor memory device. In the context of BLSA structure, the integration density of a folded BLSA type is greater than that of an open BLSA type. However, when a 6F2 type memory cell structure is used, a folded BLSA type semiconductor memory device cannot be used, and instead, an open BLSA type semiconductor memory device can be used. However, when the open BLSA type semiconductor memory device is used, a dummy cell block must be included in the constituent semiconductor memory device, and this inclusion of a dummy cell block requires additional space on the chip and generally runs against efforts to increase the integration density of the semiconductor device.

SUMMARY OF THE INVENTION

Embodiments of the present inventive concept provide a semiconductor memory device providing improved integration density despite the ill-effect of necessarily including a dummy cell block.

According to an aspect of the inventive concept, there is provided a semiconductor memory device having an open bitline memory structure, comprising; a memory block comprising a memory cell arrangement, an edge sense amplification block comprising a first sense amplifier comprising a first bitline, a first complementary bitline, and a first amplification circuit comprising a first transistor having a first size, a central sense amplification block comprising a second sense amplifier comprising a second bitline, a second complementary bitline, and a second amplification circuit comprising a second transistor having a second size different from the first size, and a capacitor block electrically connected to the edge sense amplification block.

According to another aspect of the inventive concept, there is provided a semiconductor memory device having an open bitline memory structure, comprising; an edge sense amplification block comprising a first sense amplifier connected to a first memory cell arrangement of an edge memory block, the first sense amplifier comprising a first equalization circuit connected to a first power signal, a central sense amplification block comprising a second sense amplifier connected to a second memory cell arrangement of the edge memory block, the second sense amplifier comprising a second equalization circuit connected to a second power signal, and a power generation device that generates the first power signal and the second power signal, wherein the first power signal is provided to the first equalization circuit through a different signal path than the second power signal is provided to the second equalization circuit.

According to another aspect of the inventive concept, there is provided a semiconductor memory device comprising an array block, wherein the array block comprises a plurality of memory blocks, a plurality of sense amplification blocks, and at least one capacitor block, the plurality of memory blocks each comprise an edge memory block disposed proximate an edge of the array block, and a central memory block disposed within an inner portion of the array block, and the plurality of sense amplification blocks comprise an edge sense amplification block disposed between the capacitor block and the edge memory block, and a central sense amplification block disposed between the edge memory block and the central memory block.

According to another aspect of the inventive concept, there is provided a semiconductor memory device having an open bitline memory structure, comprising; an edge sense amplification block arranged on an edge of an array block and comprising a first sense amplifier connected between a first bitline and a second bitline, a second sense amplification block arranged within an inner portion of the array block and comprising a second sense amplifier connected between a third bitline and a fourth bitline, a capacitor block comprising a capacitor connected to at least one selected from a group consisting of the first bitline and the second bitline, and a balance switch block arranged between the first sense amplification block and the second sense amplification block to electrically connect the at least one selected from the group consisting of the first bitline and the second bitline to at least one selected from another group consisting of the third bitline and the fourth bitline.

According to another aspect of the inventive concept, there is provided a method of fabricating a semiconductor memory device on a substrate, the method comprising; providing an arrangement of blocks a capacitor block, a dummy edge block, an edge sense amplification block, an edge memory block, a central sense amplification block, and a central memory block, removing the dummy edge block, arranging the capacitor block at an edge of the substrate, arranging the central sense amplification block and the central memory block in an inner portion of the substrate, and arranging the edge sense amplification block and the edge memory block between the capacitor block and the central sense amplification block, wherein the edge sense amplification block comprises a first sense amplifier including a first amplification circuit comprising a first transistor having a first size, and the central sense amplification block has a layout configuration substantially the same as the edge sense amplification block, and comprises a second sense amplifier including a second amplification circuit comprising a second transistor corresponding in a position within the second amplification circuit to a position of the first transistor within the first amplification circuit and having a second size different from the first size.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

The inventive concept will now be described more fully with reference to the accompanying drawings in which exemplary embodiments of the inventive concept are shown. Throughout the written description and drawings, like reference numbers and labels are used to denote like or similar elements.

Figure 1:
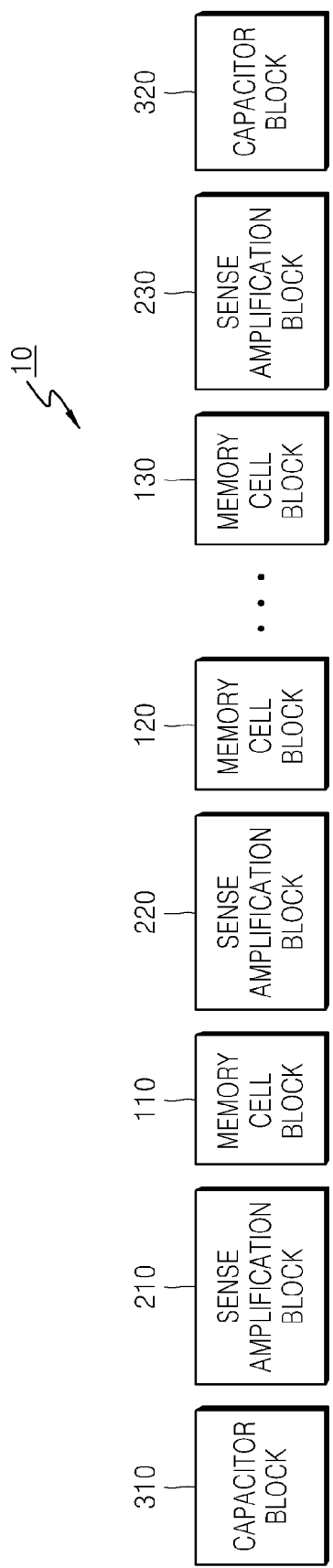
FIG. 1 is a block diagram of a semiconductor memory device according to an embodiment of the inventive concept.

FIG. 1 is a block diagram of a semiconductor memory device 10 according to an embodiment of the inventive concept.

Referring to FIG. 1, the semiconductor memory device 10 according to the illustrated embodiment includes a plurality of memory cell blocks 110, 120, and 130 and a plurality of sense amplification blocks 210, 220, and 230. The memory cell blocks 110, 120, and 130 are arranged in an alternating arrangement with the sense amplification blocks 210, 220, and 230. The "edge" sense amplification blocks 210 and 230 are arranged at an edge of the semiconductor memory device 10 may have a different structure from that of the "central" (i.e., non-edge disposed) sense amplification block 220. Capacitor blocks 310 and 320 are also included in the semiconductor memory device 10 and are arranged adjacent to the edge sense amplification blocks 210 and 230. Thus, FIG. 1 illustrates one example of an array block constituting the semiconductor memory device 10. So, it may be said that the single array block of FIG. 1 includes the memory cell blocks 110, 120, and 130, the sense amplification blocks 210, 220, and 230, and the capacitor blocks 310 and 320. Although not shown in FIG. 1, other example of a semiconductor memory device consistent with an embodiment of the inventive concept may include multiple array blocks. When a dummy cell block (not shown) is removed from the semiconductor memory device 10 during the fabrication process, a capacitance imbalance may occur between a bitline BL and a complementary bitline BLB disposed in one of the memory cell blocks 110, 120, and 130. Accordingly, the capacitor blocks 310 and 320 are included in the semiconductor memory device 10 in order to compensate for this capacitance imbalance.

Figure 2:
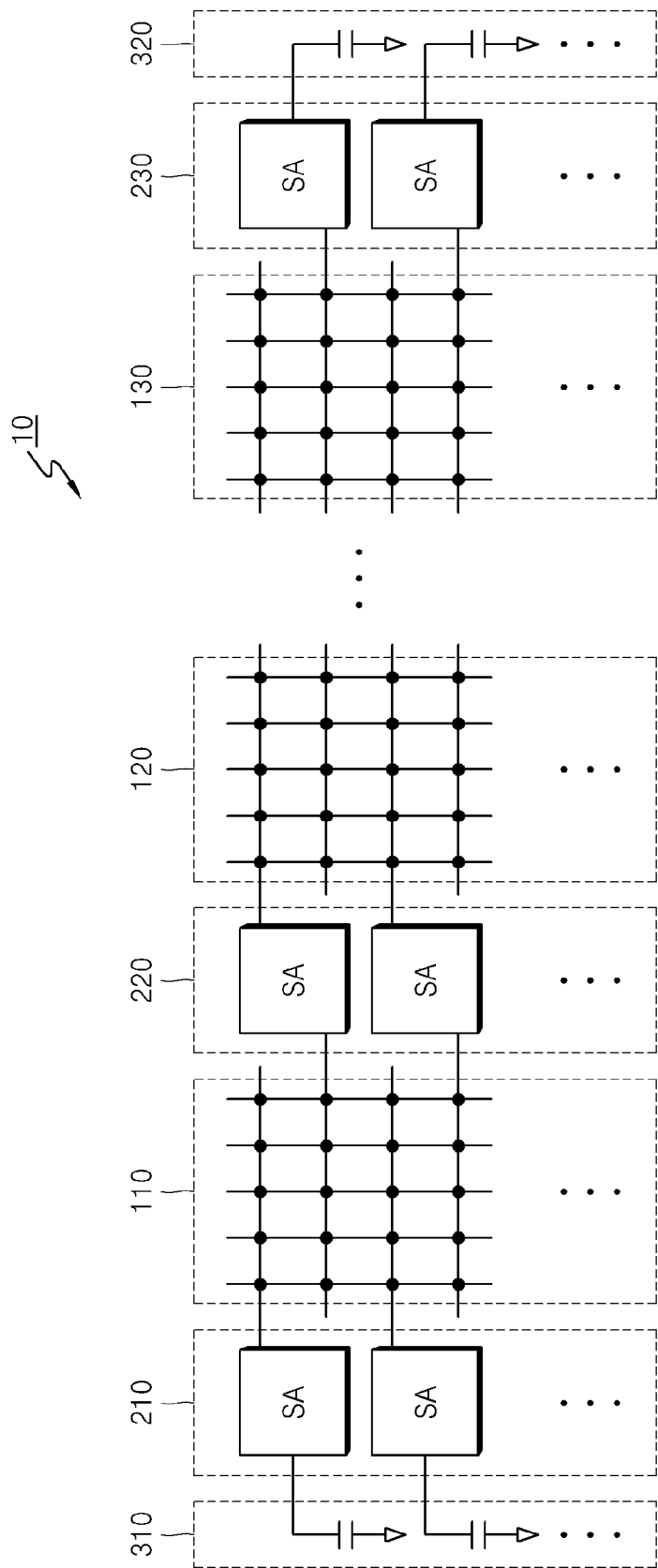
FIG. 2 is a circuit diagram of an embodiment of the semiconductor memory device of FIG. 1.

FIG. 2 is a circuit diagram further illustrating the embodiment of FIG. 1.

Referring to FIG. 2, each of the sense amplification blocks 210, 220, and 230 includes a plurality of sense amplifiers (SAs). Each of the capacitor blocks 310 and 320 includes a plurality of capacitors. The capacitors are arranged to prevent a capacitance imbalance between a respective bitline BL and complementary bitline BLB, and may thus be referred to as balance capacitors. Each of the memory cell blocks 110, 120, and 130 include an arrangement of memory cells disposed in relation to bitlines and wordlines.

Each of the SAs is connected to a capacitor and/or a memory array. For example, some of the SAs may be connected to memory cells in both directions. Alternatively, some of the SAs may be connected to memory arrangements in one direction and may be connected to capacitors in the other direction. As shown in FIG. 1, a plurality of sense amplification blocks may be arranged within an array block. The SAs included in edge sense amplification blocks (e.g., sense amplification blocks 210 and 230) may be connected to the capacitors. Accordingly, the SAs of the edge sense amplification blocks 210 and 230 connected to the capacitor blocks 310 and 320 may have a different size than the SAs of central sense amplification blocks (e.g., sense amplification block 220) which are not connected to the capacitor blocks 310 and 320. For example, the SAs of the edge sense amplification blocks 210 and 230 may be sized to be greater than the SAs of the central sense amplification block 220. Although FIGS. 1 and 2 illustrate that only one central sense amplification block 220 in a single array block, two or more central sense amplification blocks may be included in any given single array block.

Figure 3A:
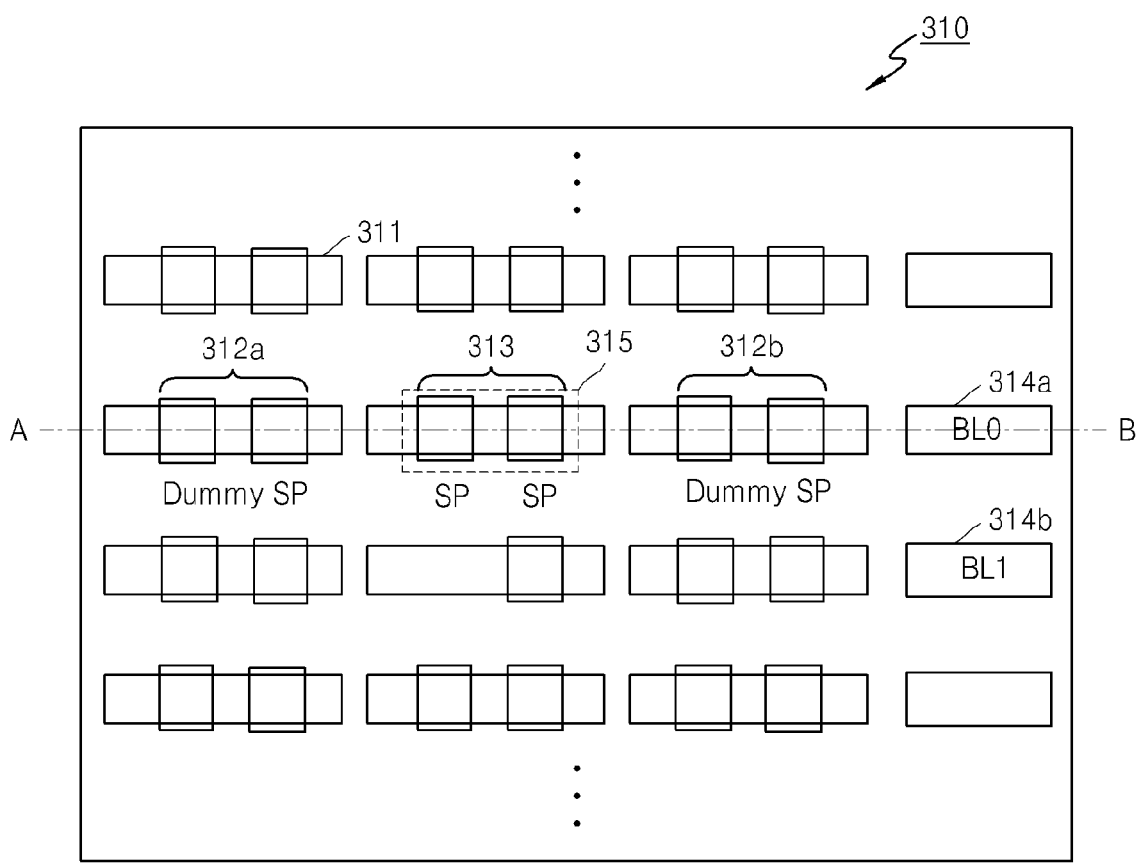
FIGS. 3A and 3B are a plan view and a cross-sectional view of a semiconductor layout of a capacitor block of the semiconductor memory device of FIG. 2.
Figure 3B:
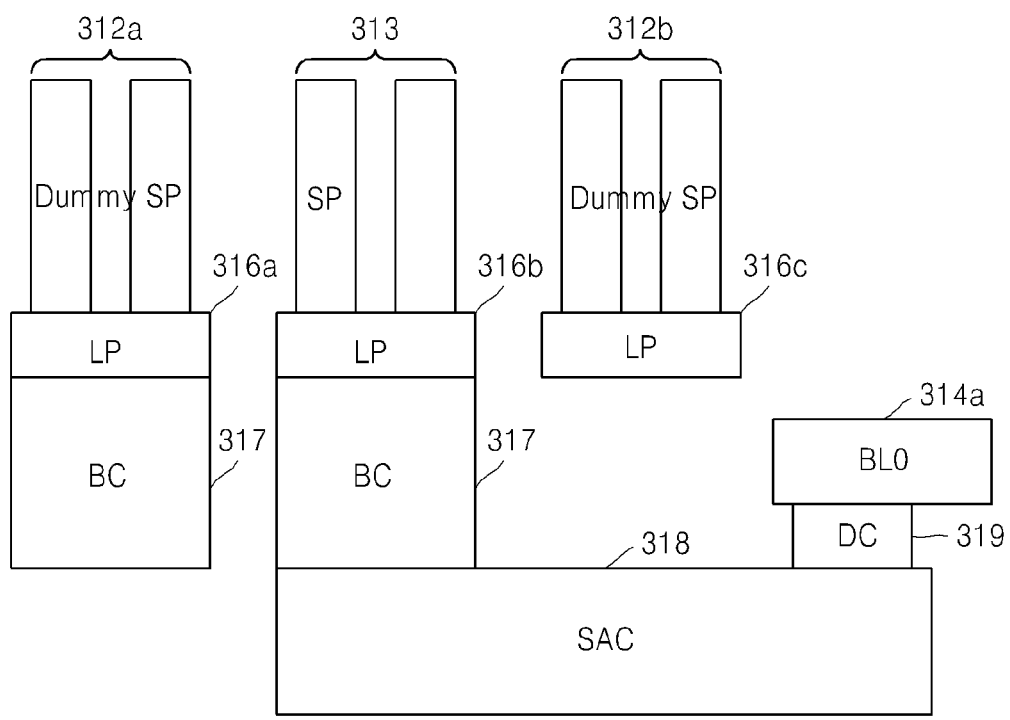

FIG. 3A is a plan view and FIG. 3B is a cross-sectional view of the capacitor block 310 of FIG. 2.

Referring to FIG. 3A, the capacitor block 310 may be formed by arranging a plurality of landing pads (LPs) 311 and a plurality of dummy storage polysilicons (hereinafter, referred to as polys) (Dummy SPs) 312a and 312b and storage polys SPs 313 thereon. Bitlines BL0 and BL1 (namely, 314a and 314b) may be located on the right side of dummy SPs. For example, a capacitor 315 included in the capacitor block 310 may be located between the dummy SPs 312a and 312b.

Referring to FIG. 3B, LPs 316a, 316b, and 316c are disposed below the dummy SPs 312a and 312b and the SPs 313. The SPs 313 between the dummy SPs 312a and 312b is located over the LP 316b, and a buried contact (BC) 317 is located below the LP 316b. The BC 317 is located over one part of a self-aligned contact (SAC) 318, and a direct contact (DC) 319 is located over the other part of the SAC 318. The bit line (BL0) 314a is located over the DC 319 to be connected to the DC 319. According to one particular embodiment of the inventive concept, a dummy cell may be removed from the edge of the array block, and the SP 313 connected to the bitline 314a may then function as a balancing element that replaces a capacitance formed by the structure of the dummy cell.

Figure 4A:
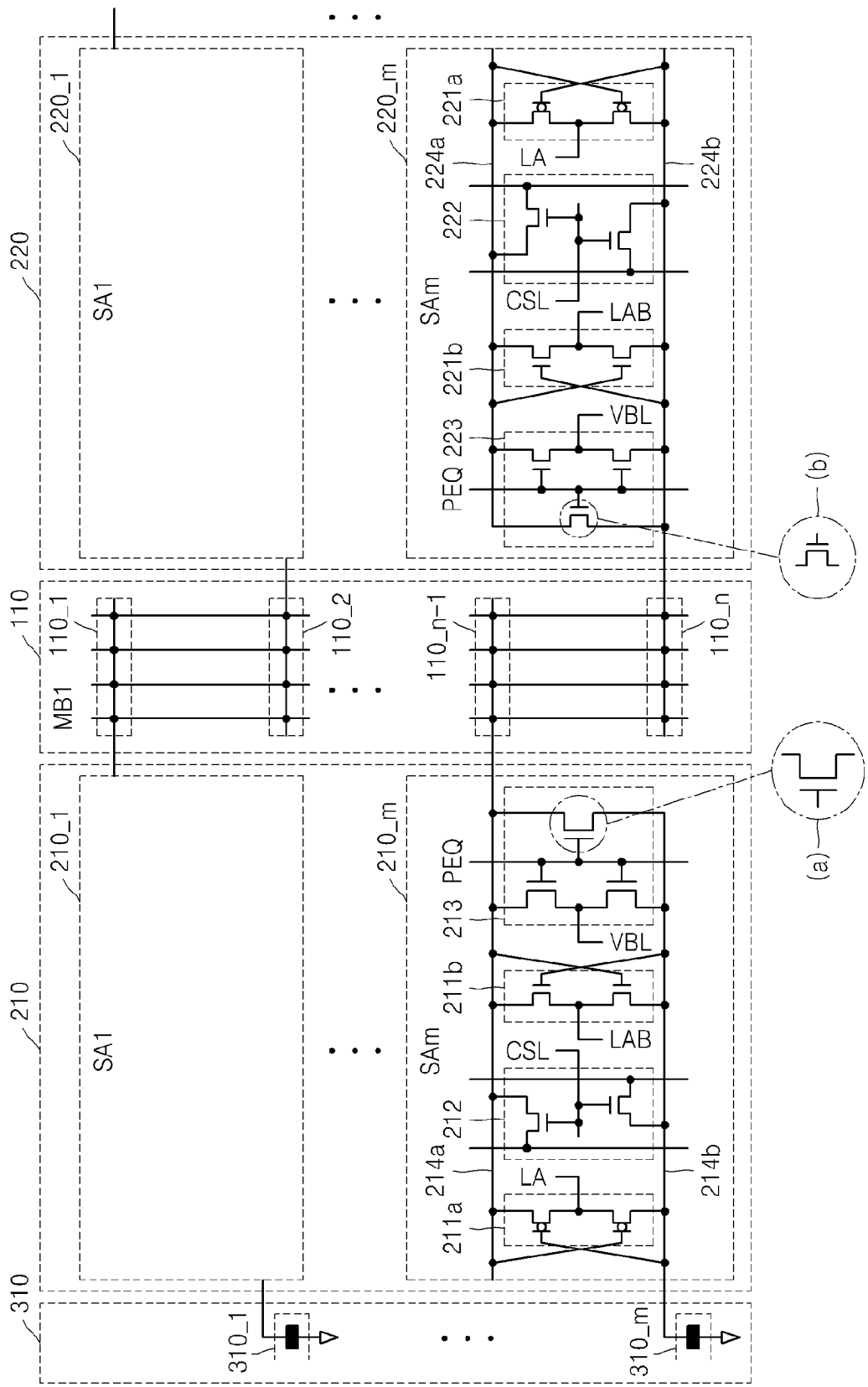
FIGS. 4A and 4B are circuits and layouts further illustrating the embodiment of the semiconductor memory device of FIG. 1.
Figure 4B:
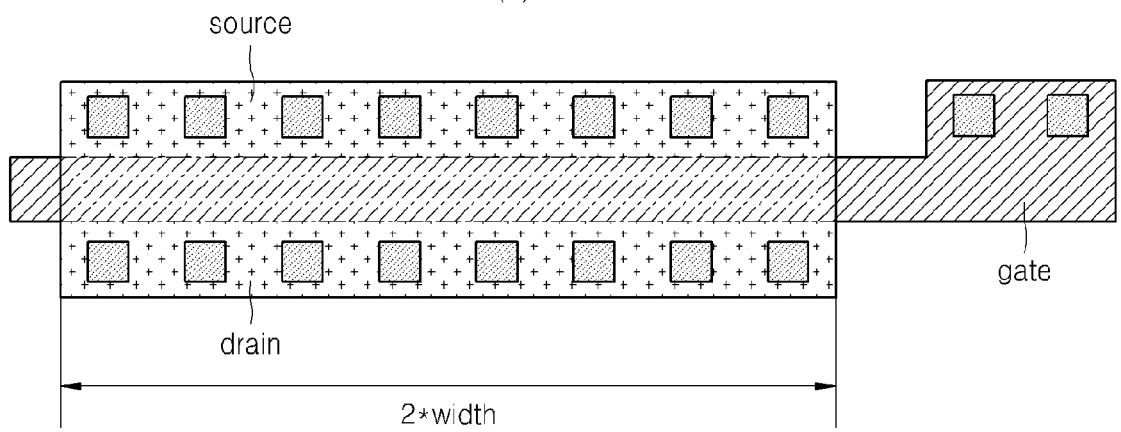

FIG. 4A is a circuit diagram and FIG. 4B is a layout diagram further illustrating the semiconductor memory device 10 of FIG. 1.

Referring to FIG. 4A, the edge sense amplification block 210 disposed adjacent to the capacitor block 310 includes a plurality of SAs 210_1 through 210_m. A single memory cell block (e.g., a first memory cell block (MB1) 110) includes a plurality of memory cell arrangements 110_1, 110_1, . . . , 110_n-1, and 110_n. The central sense amplification block 220 includes a plurality of SAs 220_1, . . . , and 220_m. Each SA of the edge sense amplification block 210 (e.g., the m-th SA 210_m) includes a bitline 214a and a complementary bitline 214b, and a PMOS amplification circuit (PMOS SA) 211a, a column selection circuit 212, an NMOS amplification circuit (NMOS SA) 211b, and an equalization circuit 213 connected between the bitline 214a and the complementary bitline 214b.

The complementary bitline 214b is connected to a capacitor 310_m for capacitive balancing purposes. The bitline 214a is connected to one memory cell arrangement of the first memory cell block 110 (e.g., the (n−1)th memory arrangement 110_n−1). The (n−1)th memory arrangement 110_n−1 includes a plurality of memory cells. Each SA of the central sense amplification block 220 (e.g., the m-th SA 220_m) includes a bitline 224a and a complementary bitline 224b, and a PMOS amplification circuit (PMOS SA) 221a, a column selection circuit 222, an NMOS amplification circuit (NMOS SA) 221b, and an equalization circuit 223 connected between the bitline 224a and the complementary bitline 224b.

The complementary bitline 224b is connected to one memory cell arrangement of the first memory cell block 110 (e.g., the n-th memory arrangement 110_n). The bitline 224a is also connected to a memory cell arrangement in another memory cell block (e.g., a memory cell block (not shown) located on the right side of the first memory cell block 110).

The edge sense amplification block 210 and the central sense amplification block 220 are, thus, symmetrical about the first memory cell block 110. When the bitline 214a and the complementary bitline 214b are located on both sides of the PMOS and NMOS amplification circuits of the sense amplification block 210_m as illustrated in FIG. 4A, this is typically referred to as an open bitline sense amplification memory structure.

During equalization and pre-charging of the bitline 214a and the complementary bitline 214b, the time duration required for the voltage of the bitline 214a and the complementary bitline 214b to become a VBL voltage (e.g., ½ of a voltage provided to the memory arrangement, and hereinafter referred to as "tRP") may have different values in the case of a capacitance imbalance verse a case of capacitance balance. For example, the duration tRP is greater when a dummy cell block on the edge of an array block is removed (i.e., in the case of a capacitance imbalanced) than when the dummy cell block on the edge is not removed (i.e., in the case of a capacitance balance). These different durations tRP may result in the deterioration of certain performance characteristics for memory operation. In order to prevent a capacitance imbalance between the bitline 214a and the complementary bitline 214b due to the removal of the dummy cell block from the edge of an array block, the complementary bitline 214b of the m-th SA 210_m of the edge sense amplification block 210 is connected to the capacitor 310_m in the capacitor block 310.

In every semiconductor process, certain process deviations will typically arise. In other words, when different capacitors are formed using various semiconductor process(es), the respective capacitances may vary and may not precisely balance a connected bitline. When capacitances vary, a loss of duration tRP characteristics may be generated during pre-charging, as compared with an ideal circuit wherein capacitances are exactly equal. To address this problem, at least one of a plurality of transistors included in the m-th SA 210_m of the edge sense amplification block 210 may be designed with a different size than a corresponding transistor of the m-th SA 220_m of the central sense amplification block 220.

Accordingly, in the example of FIG. 4A, a transistor of the equalization circuit 213 included in the m-th SA 210_m of the edge sense amplification block 210 is designed to have a different size than the corresponding transistor of the equalization circuit 223 included in the m-th SA 220_m of the central sense amplification block 220. The transistor of the equalization circuit 213 of the edge sense amplification block 210 may be designed to have a size greater than that of the transistor of the equalization circuit 223 of the central sense amplification block 220. This greater sized transistor will increase the driving capability of the equalization circuit 213 of the edge sense amplification block 210. Alternatively, the greater sized transistor will allow the level of a threshold voltage for the transistor of the equalization circuit 213 of the edge sense amplification block 210 to be less than that of the corresponding transistor of the equalization circuit 223 of the central sense amplification block 220.

Figure 4B:
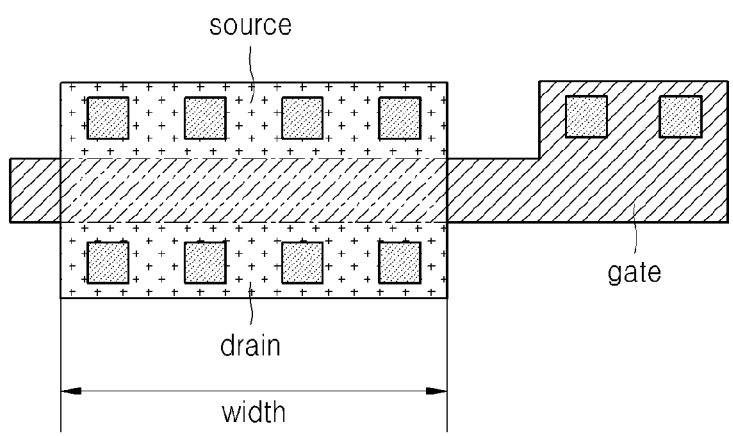

FIG. 4B(a) illustrates an embodiment of a transistor of the equalization circuit 213 of the edge sense amplification block 210 and FIG. 4(B(b) illustrates an embodiment of a transistor of the equalization circuit 223 of the central sense amplification block 220. As described above, the transistor of FIG. 4B(a) included in the equalization circuit 213 has a greater size than the transistor of FIG. 4B(b) of the equalization circuit 223. In the particular examples of FIG. 4B, the size of the transistor in the equalization circuit 213 is twice that of the transistor in the equalization circuit 223. When the transistors of the edge sense amplification block 210 are designed with a different (e.g., greater) size than those of the central sense amplification block 220, those of ordinary skill in the art will understand than many different layout variables (such as those shown in FIG. 4B) may be used to respectively define the transistors.

Figure 5A:
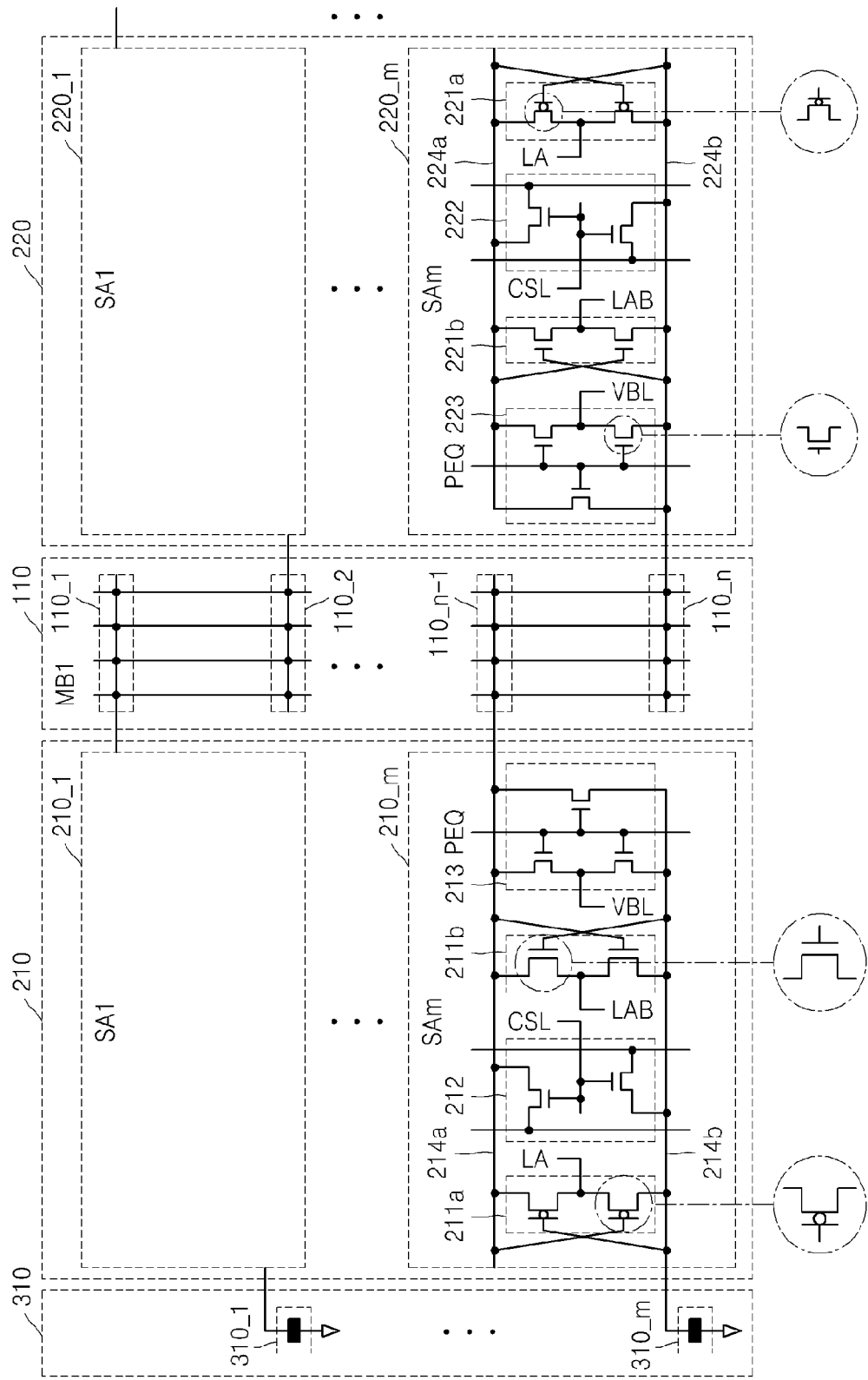
FIGS. 5A and 5B are respectively a circuit diagram of a semiconductor memory device in which a transistor of an amplification circuit in a first sense amplifier has a size different from that of a transistor of an amplification circuit in a second sense amplifier, and related graphs (FIGS. 5(B)(a) and 5(B)(b)) showing the characteristics obtained due to the use of transistors having different sizes.
Figure 5B:
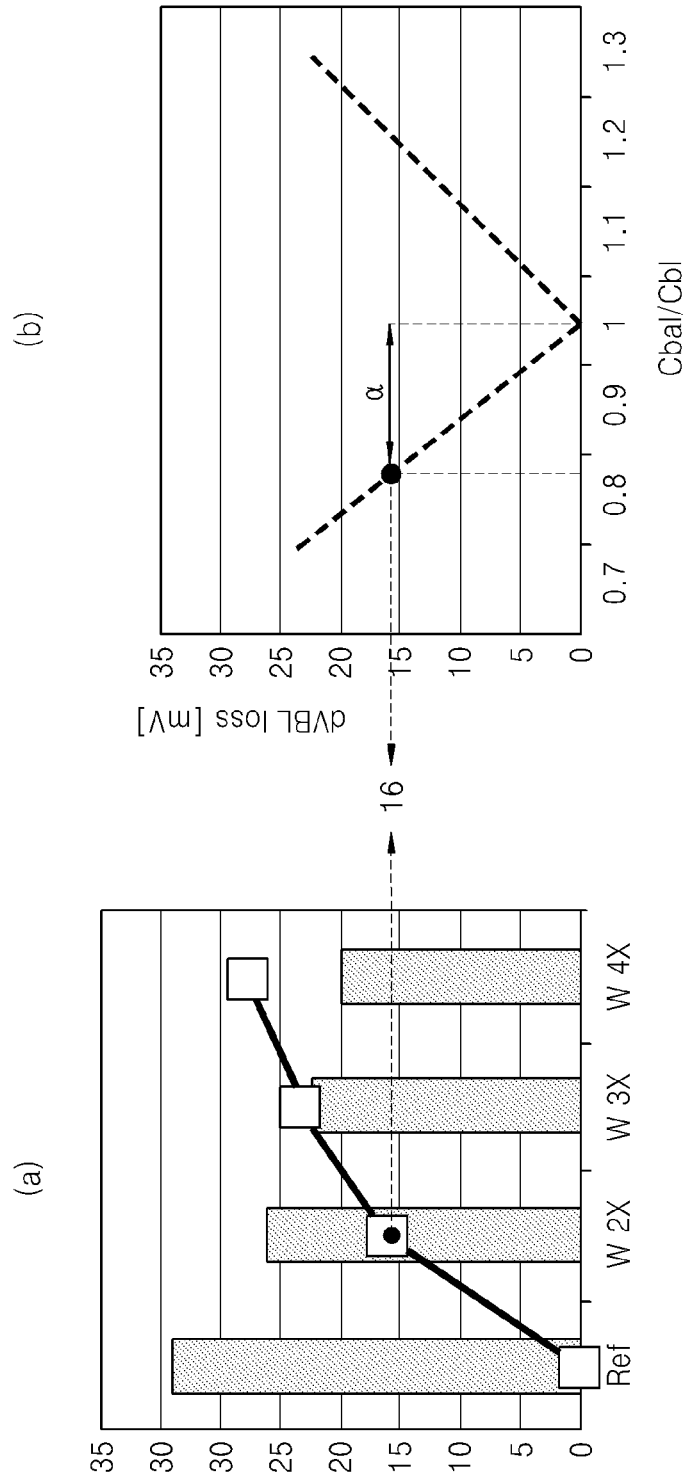

FIG. 5A is a circuit diagram of an embodiment in which a transistor of an amplification circuit in a first SA has a different size from that of a transistor of an amplification circuit in a second SA. FIG. 5B, inclusive FIGS. 5B(a) and 5B(b), shows graphs illustrating characteristics resulting from the difference between the transistor sizes. For convenience of explanation, FIG. 5A illustrates only the m-th SA 210_m of the edge sense amplification block 210 and only the m-th the m-th SA 220_m of the central sense amplification block 220.

In the circuit diagram of FIG. 5A, the voltage levels of the bitline 214a and the complementary bitline 214b become equal due to charge sharing. However, when there is a capacitance imbalance between the bitline 214a and the complementary bitline 214b and pre-charge is performed using a predetermined duration tRP, a deviation between the voltage level apparent on the bitline 214a and that apparent on the complementary bitline 214b may arise. That is, in a case of capacitance imbalance, a VBL level may be greater than a deviation when the capacitances of the bitline 214a and the complementary bitline 214b are balanced. Charge on a bitline and a cell node are shared, and a voltage difference between a bitline and a complementary bitline (hereinafter, referred to as "del VBL") is generated. However, the del VBL where the deviation is great may be smaller as compared with a balanced case where the deviation is small or not generated at all. In other words, the del VBL of the edge sense amplification block 210 and the central sense amplification block 220 may be different from each other. When the del VBL of the edge sense amplification block 210 decreases, sense amplification capabilities of the m-th SA 210_m of the edge sense amplification block 210 may decrease.

To compensate for the decrease of the sense amplification capabilities, the PMOS amplification circuit 211a and the NMOS amplification circuit 211b of the m-th SA 210_m of the edge sense amplification block 210 may be designed to have sizes greater than those of the PMOS amplification circuit 221a and the NMOS amplification circuit 221b of the m-th SA 220_m of the central sense amplification block 220. For example, a transistor of the PMOS amplification circuit 211a of the edge sense amplification block 210 may be designed to have a size greater than that of a transistor of the PMOS amplification circuit 221a of the central sense amplification block 220. Moreover, a transistor of the NMOS amplification circuit 211b of the edge sense amplification block 210 may be designed to have a size greater than that of a transistor of the NMOS amplification circuit 221b of the central sense amplification block 220.

In each of the PMOS amplification circuit 211a and the NMOS amplification circuit 211b, a threshold voltage Vth of a transistor may vary as the result of process variations during fabrication. The variation of the threshold voltage Vth may cause the sensing capability of each of the PMOS and NMOS amplification circuits 211a and 211b to be reduced. In other words, when the variation of the threshold voltage Vth decreases, the sensing capability of each of the PMOS and NMOS amplification circuits 211a and 211b increases. Accordingly, a method for reducing the variation of the threshold voltage Vth is required. For example, the variation of the threshold voltage Vth may be reduced using a method of increasing the size of a transistor of a SA, thereby increasing the sensing capability of each of the PMOS and NMOS amplification circuits 211a and 211b. Thus, the reduction of the sensing capability due to a deviation caused by capacitance imbalance and a del VBL loss caused by the deviation may be compensated.

FIG. 5B(a) is a graph showing a decrease in mismatch according to the size of an amplification circuit, and a variation in a del VBL gain caused by the mismatch decrease. As the width of a gate of a transistor in a SA increases 1 time, 2 times, 3 times, and 4 times a reference width Ref as in Ref, W2X, W3X, and W4X, respectively, on the horizontal axis of the graph of FIG. 5B(a), the del VBL gain increases from 0 to 16, 23, and 27 as shown on the vertical axis.

FIG. 5B(b) is a graph showing del VBL loss according to a ratio of an overall capacitance Cba1 of the complementary bitline 214b included in the m-th SA 210_m of the edge sense amplification block 210 and connected to the balance capacitor 310_m to an overall capacitance Cb1 of the bitline 214a included in the m-th SA 210_m of the edge sense amplification block 210 and connected to the memory arrangement 110_n-1 of the memory cell block 110. Referring to FIG. 5B, when the del VBL gain when the sizes of the gates of the transistors of the amplification circuits 211a and 211b of the m-th SA 210_m are twice (W2X) is 16 mV, a del VBL margin of "α" for mismatch between the bitline 214a and the complementary bitline 214b may be secured.

Figure 6:
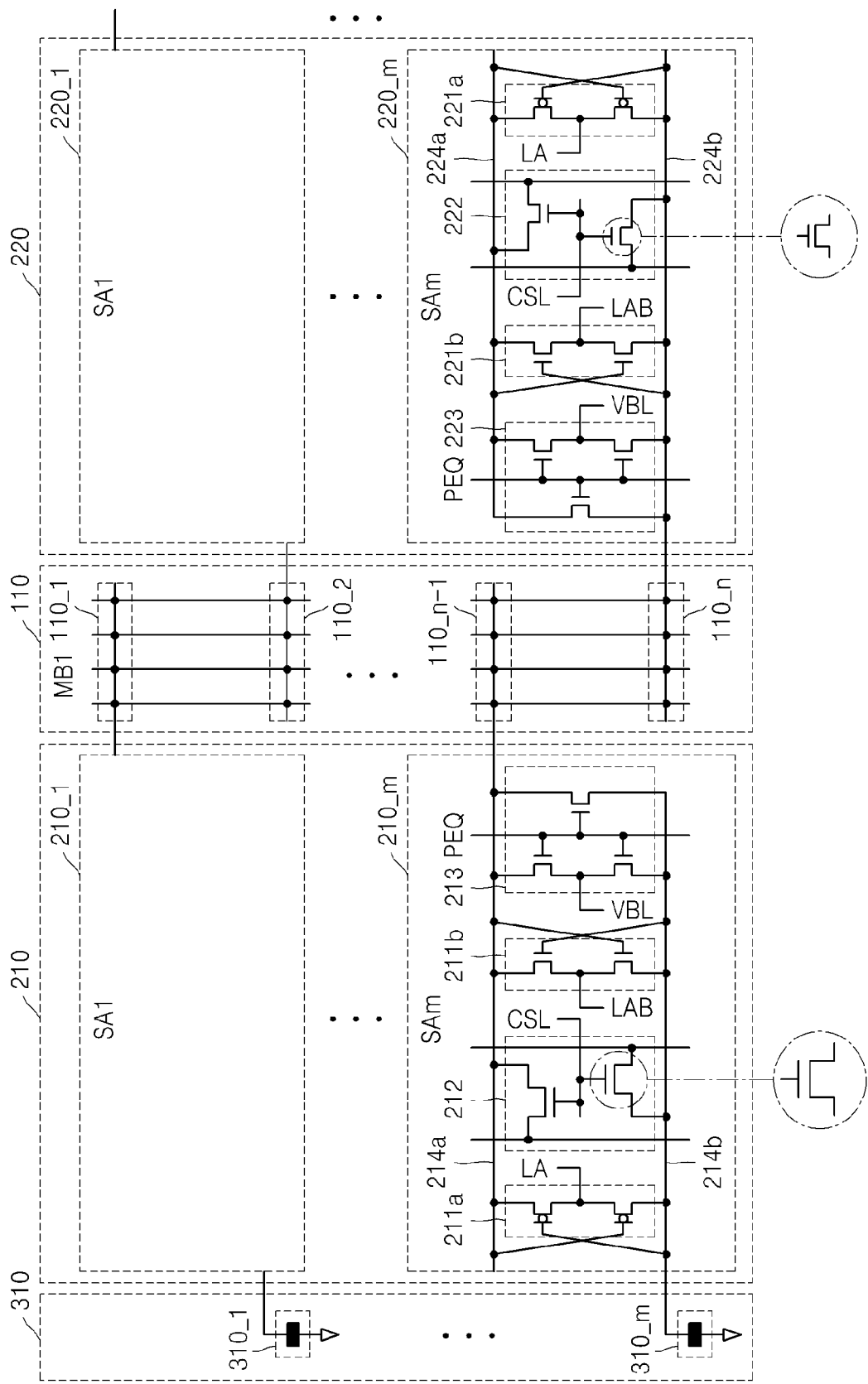
FIG. 6 is a circuit diagram illustrating the use of different sized transistors in column selection circuits of a sense amplification blocks.

FIG. 6 is a circuit diagram further illustrating an embodiment of the inventive concept in which transistors of column selection circuits of sense amplification blocks have different sizes. For convenience of explanation, FIG. 6 illustrates only the m-th SA 210_m of the edge sense amplification block 210 and only the m-th the m-th SA 220_m of the central sense amplification block 220.

The m-th SA 210_m of the edge sense amplification block 210 may also include the column selection circuit 212 in addition to the equalization circuit 213 and the PMOS and NMOS amplification circuits 211a and 211b. In order to increase the driving capability of the m-th SA 210_m of the edge sense amplification block 210, the size of a transistor included in the column selection circuit 212 of the m-th SA 210_m may be increased to be greater than that of a transistor included in the column selection circuit 222 of the m-th SA 220_m of the central sense amplification block 220. Accordingly, the sense amplification capability of the edge sense amplification block 210 increases.

Figure 7:
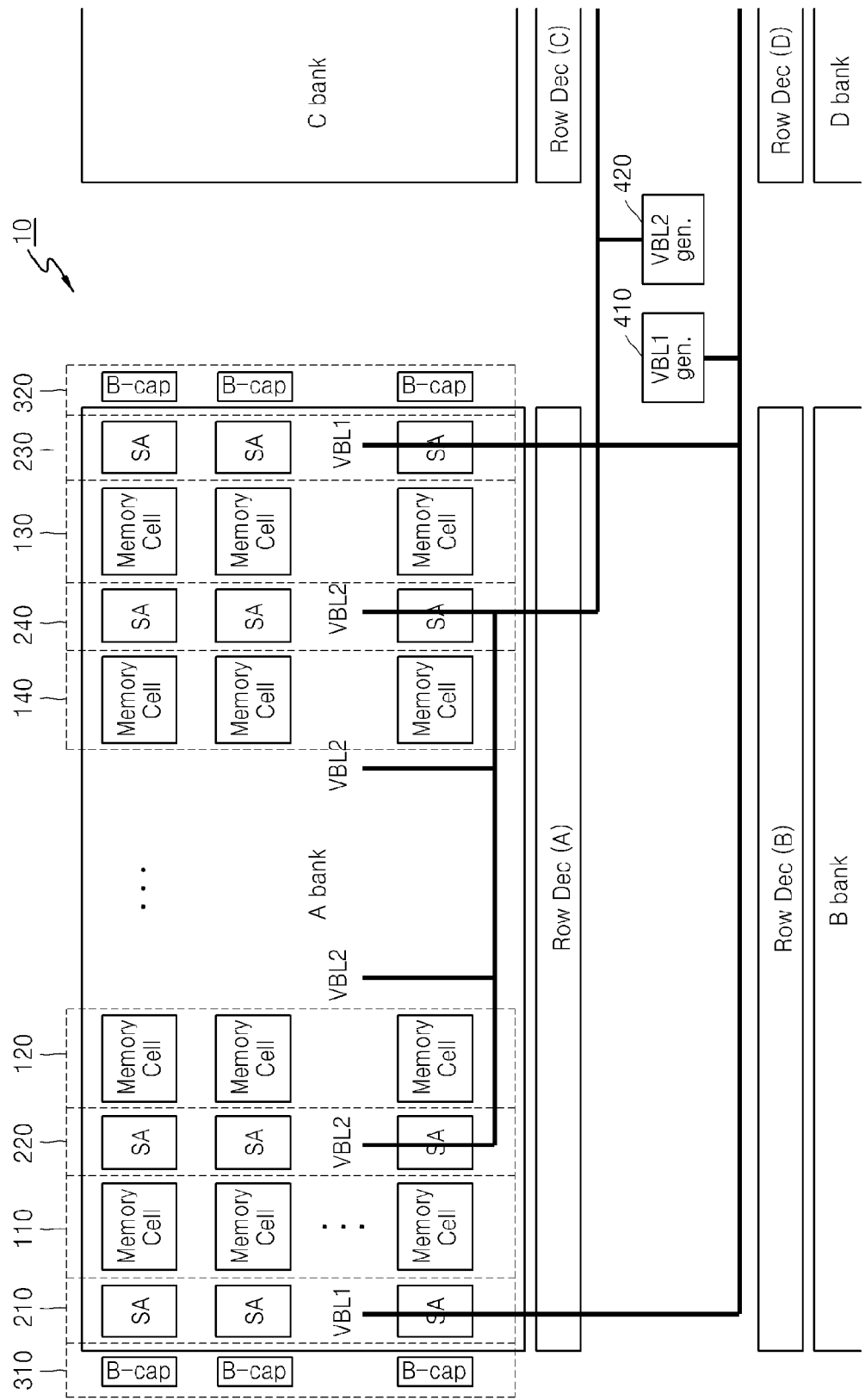
FIG. 7 is a block diagram of a semiconductor memory device according to another embodiment of the inventive concept.

FIG. 7 is a block diagram of a semiconductor memory device 10 according to another embodiment of the inventive concept.

If capacitance imbalance exists between the bitline 214a and the complementary bitline 214b, a predetermined number of accesses to the edge sense amplification block 210 in which imbalance is generated may affect the level of a precharge voltage. Accordingly, when the central sense amplification block 220 is then accessed, loss of duration tRP characteristics for the central sense amplification block 220 may be generated. To address this problem, as shown in FIG. 7, a precharge voltage (e.g., a first precharge voltage VBL1) provided to the edge sense amplification block 210 may be differently defined than a precharge voltage (e.g., a second precharge voltage VBL2) provided to the central sense amplification block 220. To achieve this different voltage definition, a precharge voltage generation unit 410 generating the first precharge voltage VBL1 (hereinafter, referred to as a first precharge voltage generation unit 410) and a precharge voltage generation unit 420 generating the second precharge voltage VBL2 (hereinafter, referred to as a second precharge voltage generation unit 420) may be separately included in the semiconductor memory device 10.

Two edge sense amplification blocks 210 and 230 exist for each of a plurality of array blocks included in the semiconductor memory device 10. Accordingly, as many first precharge voltages VBL1 as $2^N$ (where "N" is the number of array blocks) may be generated. If first precharge voltages VBL1 are generated in the same precharge voltage generation unit as are commonly provided to all array blocks, only the first precharge voltage generation unit 410 instead of the first and second precharge voltage generation units 410 and 420 may be included in the semiconductor memory device 10. On the other hand, if at least two array blocks are provided with the first precharge voltages VBL1 via different paths or two first sense amplification blocks 210 and 230 included in a single array block are provided with the first precharge voltages VBL1 via different paths, a plurality of first precharge voltage generation units 410 may be included in the semiconductor memory device 10.

As illustrated in FIG. 7, the first precharge voltage generation unit 410 generates the first precharge voltage VBL1 and provides the same to the edge sense amplification blocks 210 and 230 from among the sense amplification blocks included in the semiconductor memory device 10. The second precharge voltage generation unit 420 generates the second precharge voltage VBL2 and provides the same to the central sense amplification blocks 220 and 240 from among the sense amplification blocks included in the semiconductor memory device 10. The capacitor blocks 310 and 320 of FIG. 7 (hereinafter, referred to as first capacitor blocks) are connected to the first sense amplification blocks 210 and 230, respectively, arranged on the edge of an array block. In other words, the edge sense amplification blocks 210 and 230 and the central sense amplification blocks 220 and 240 may receive the first precharge voltage VBL1 and the second precharge voltage VBL2, respectively, via different paths, and the first precharge voltage VBL1 and the second precharge voltage VBL2 may have different voltage levels or the same voltage level.

Figure 8:
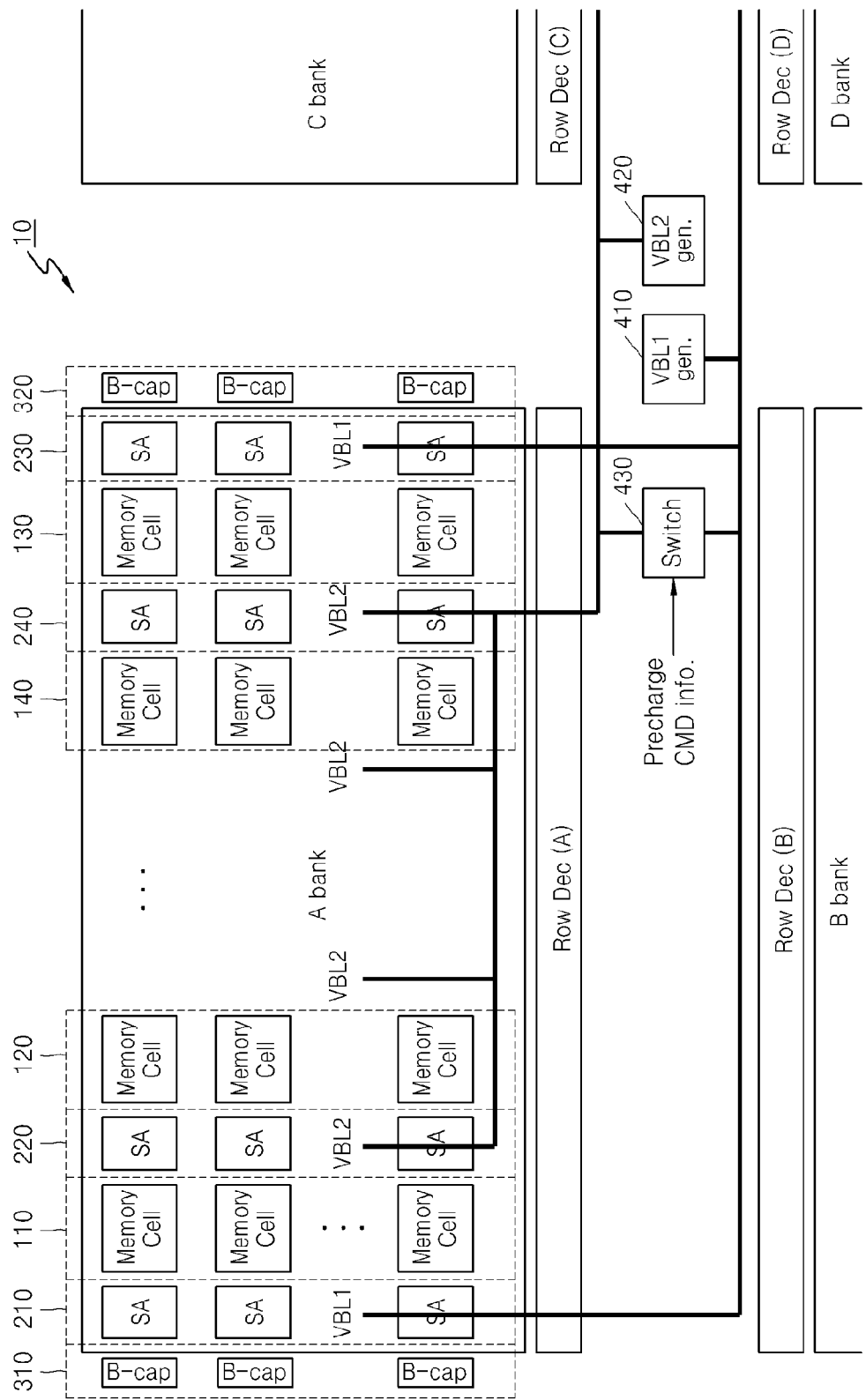
FIG. 8 is a block diagram further illustrating the switching unit included in the semiconductor memory device of FIG. 7.

FIG. 8 is a block diagram further illustrating a variation on the embodiment of the inventive concept shown in FIG. 7.

As illustrated in FIG. 8, a switch 430 for electrically connecting the first precharge voltage generation unit 410 and the second precharge voltage generation unit 420 may be further included in the semiconductor memory device 10 of FIG. 7. For example, a transmission path of the first precharge voltage VBL1 generated in the first precharge voltage generation unit 410 may be electrically connected to a transmission path of the second precharge voltage VBL2 generated in the second precharge voltage generation unit 420 by the switch 430. The ON/OFF operation of the switch 430 may be controlled according to a switch control signal, and the switch control signal may be a signal synchronized with a precharge command (CMD). Accordingly, the switch 430 may be turned OFF for a predetermined period of time in response to the precharge CMD or may be turned OFF for a predetermined period of time corresponding to a precharge duration. Accordingly, the first precharge voltage VBL1 and the second precharge voltage VBL2 are prevented from affecting each other during precharge, the first precharge voltage VBL1 and the second precharge voltage VBL2 are connected to each other by turning on the switch 430 after the precharge is concluded, and consumption of unnecessary current is prevented by disabling the first precharge voltage generation unit 410.

Figure 9A:
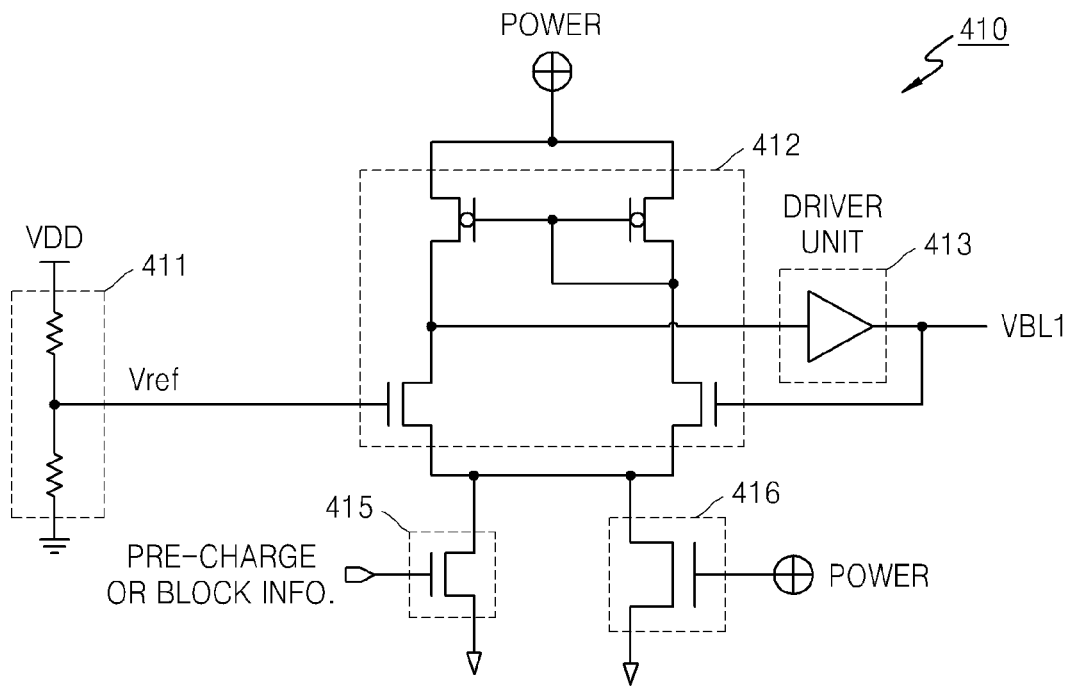
FIGS. 9A and 9B are circuit diagrams further illustrating embodiments of first and second precharge voltage generation units included in the semiconductor memory device of FIG. 8.
Figure 9B:
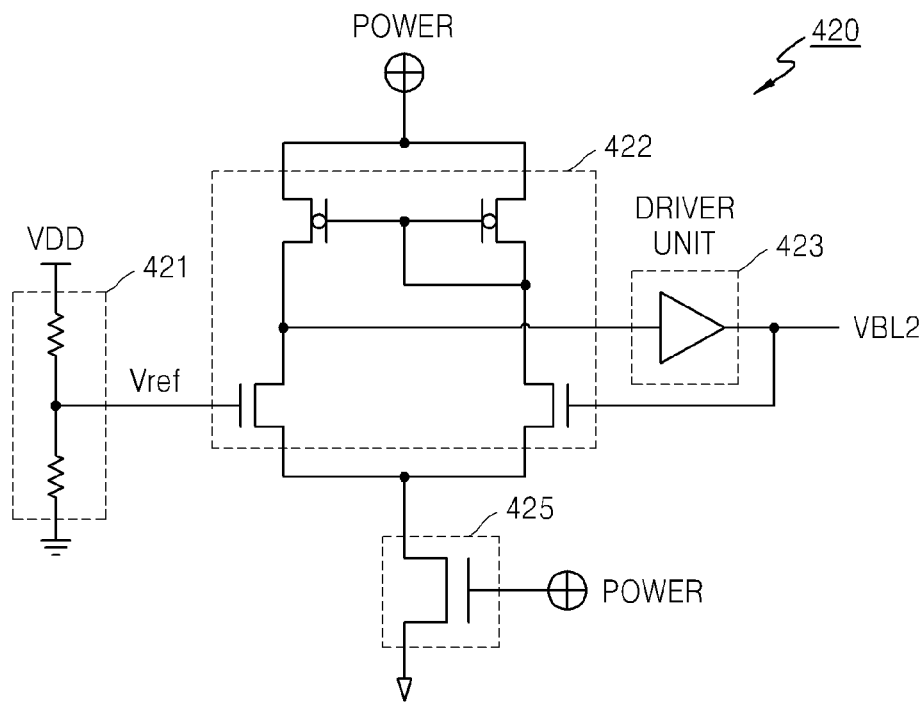

FIGS. 9A and 9B are respectively circuit diagrams further illustrating certain embodiments of the first and second precharge voltage generation units 410 and 420 illustrated in FIG. 8. As illustrated in FIGS. 9A and 9B, the first precharge voltage generation unit 410 and the second precharge voltage generation unit 420 each may include a reference unit, a comparison unit, and a driver unit. In FIG. 9A, the first precharge voltage generation unit 410 includes a reference unit 411, a comparison unit 412, and a driver unit 413. In FIG. 9B, the second precharge voltage generation unit 420 includes a reference unit 421, a comparison unit 422, and a driver unit 423. At least one switch, namely, switches 415 and 416, for controlling the first precharge voltage generation unit 410 to be enabled or disabled may be further included in the first precharge voltage generation unit 410. At least one switch 425 for controlling the second precharge voltage generation unit 420 to be enabled or disabled may be further included in the second precharge voltage generation unit 420.

In order to decrease a response time of the comparison unit 412 of the first precharge voltage generation unit 410, the size of the first precharge voltage generation unit 410 may be designed to be greater than that of the second precharge voltage generation unit 420. For example, the size of the comparison unit 412 of the first precharge voltage generation unit 410 may be designed to be greater than that of the comparison unit 422 of the second precharge voltage generation unit 420. Alternatively, the comparison unit 412 of the first precharge voltage generation unit 410 may be designed to have a different type from the comparison unit 422 of the second precharge voltage generation unit 420. FIGS. 9A and 9B illustrate that the comparison units 412 and 422 are all differential source amplifiers. A latch-type comparator (not shown) may decrease the response time, compared with the differential source amplifier, and thus the comparison unit 412 of the first precharge voltage generation unit 410 may be a latch-type comparator.

In order to improve the driving capability of the first precharge voltage generation unit 410, the switches 415 and 416 may be further included in the first precharge voltage generation unit 410, as described above. For example, the switch 415 in addition to the switch 416 being switched by a power supply voltage may be further included in the first precharge voltage generation unit 410. The switch 415 may be turned ON when the first sense amplification blocks 210 and 230 are activated, and may be turned OFF to prevent current consumption, when the first sense amplification blocks 210 and 230 are deactivated. To achieve this ON/OFF operation, the switch 415 may be switched in response to pre-charge information or block information. In other words, the switch 415 may be turned ON during a predetermined precharge duration according to the pre-charge information. Alternatively, the switch 415 may be turned ON when the first sense amplification blocks 210 and 230 are precharged, according to the block information.

Figure 9C:
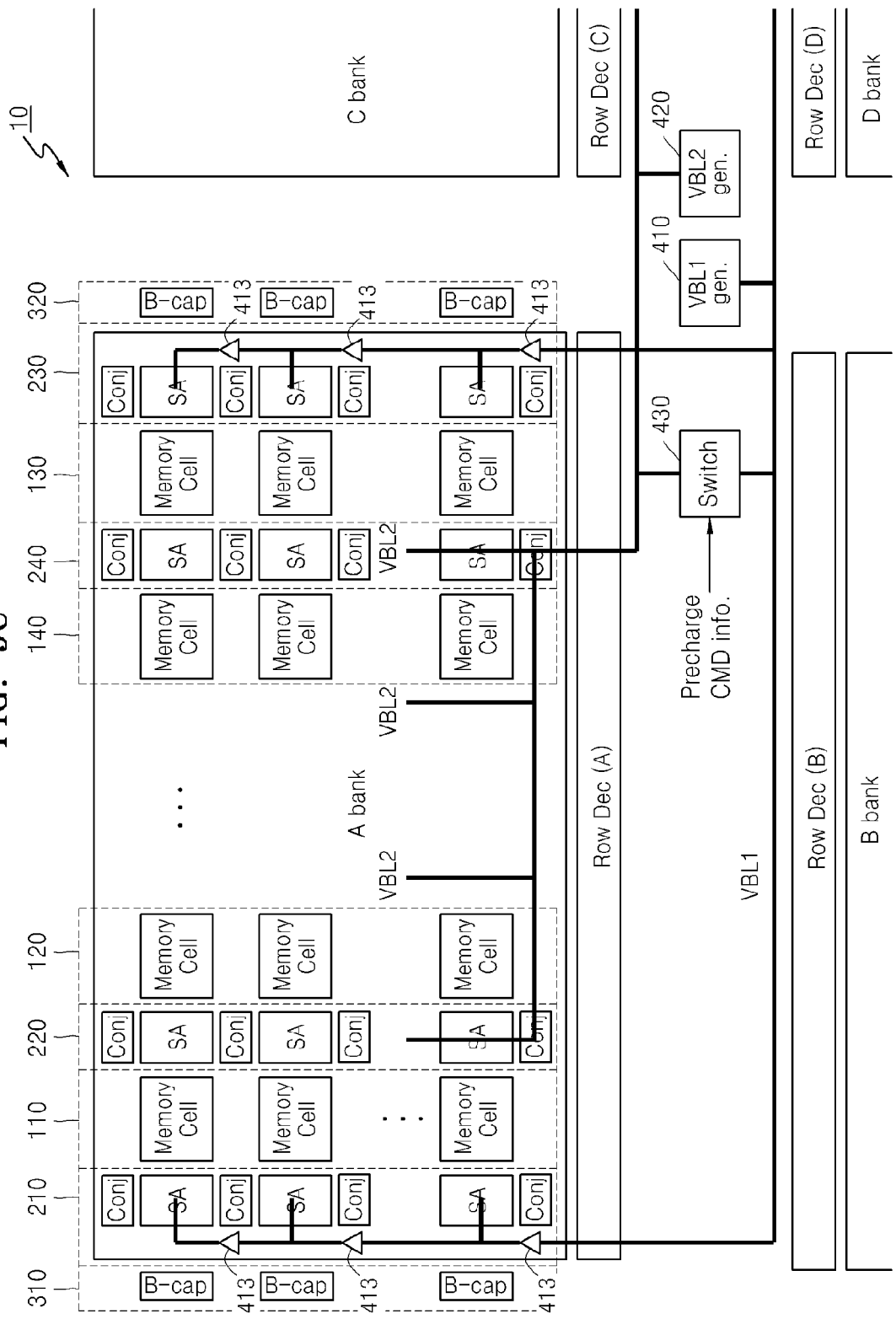
FIG. 9C illustrates another embodiment of the first precharge voltage generation unit of the semiconductor memory device of FIG. 8.

FIG. 9C illustrates another embodiment of the first precharge voltage generation unit 410 of the semiconductor memory device 10 illustrated in FIG. 8. The first precharge voltage generation unit 410 of FIG. 9C may include a plurality of driver units 413, and the plurality of the driver units 413 may be installed in each of the first sense amplification blocks 210 and 230, as illustrated in FIG. 9C. That is, the driver units 413 may be separately arranged to correspond to the SAs, respectively, of each of the first sense amplification blocks 210 and 230. FIG. 9C illustrates an example in which the driver units 413 are separately arranged to correspond to SAs, respectively.

As described above, the first precharge voltage generation unit 410 may be separately arranged to correspond to the edge sense amplification blocks 210 and 230, respectively. In this case, the comparison unit 412 and the driver unit 413 shown in FIG. 9A may be arranged to correspond to each of the edge sense amplification blocks 210 and 230. Alternatively, the comparison unit 412 may be arranged to correspond to each of the edge sense amplification blocks 210 and 230, and the driver unit 413 may be arranged to correspond to each of the SAs of each of the edge sense amplification blocks 210 and 230. The reference units 411 and 421 of FIGS. 9A and 9B may be identical with each other, and thus may be shared by the first and second precharge voltage generation units 410 and 420. Although not illustrated, as described above, the reference unit 411, the comparison unit 412, and the driver unit 413 of the first precharge voltage generation unit 410 may be arranged in various configurations within the semiconductor memory device 10.

Figure 10A:
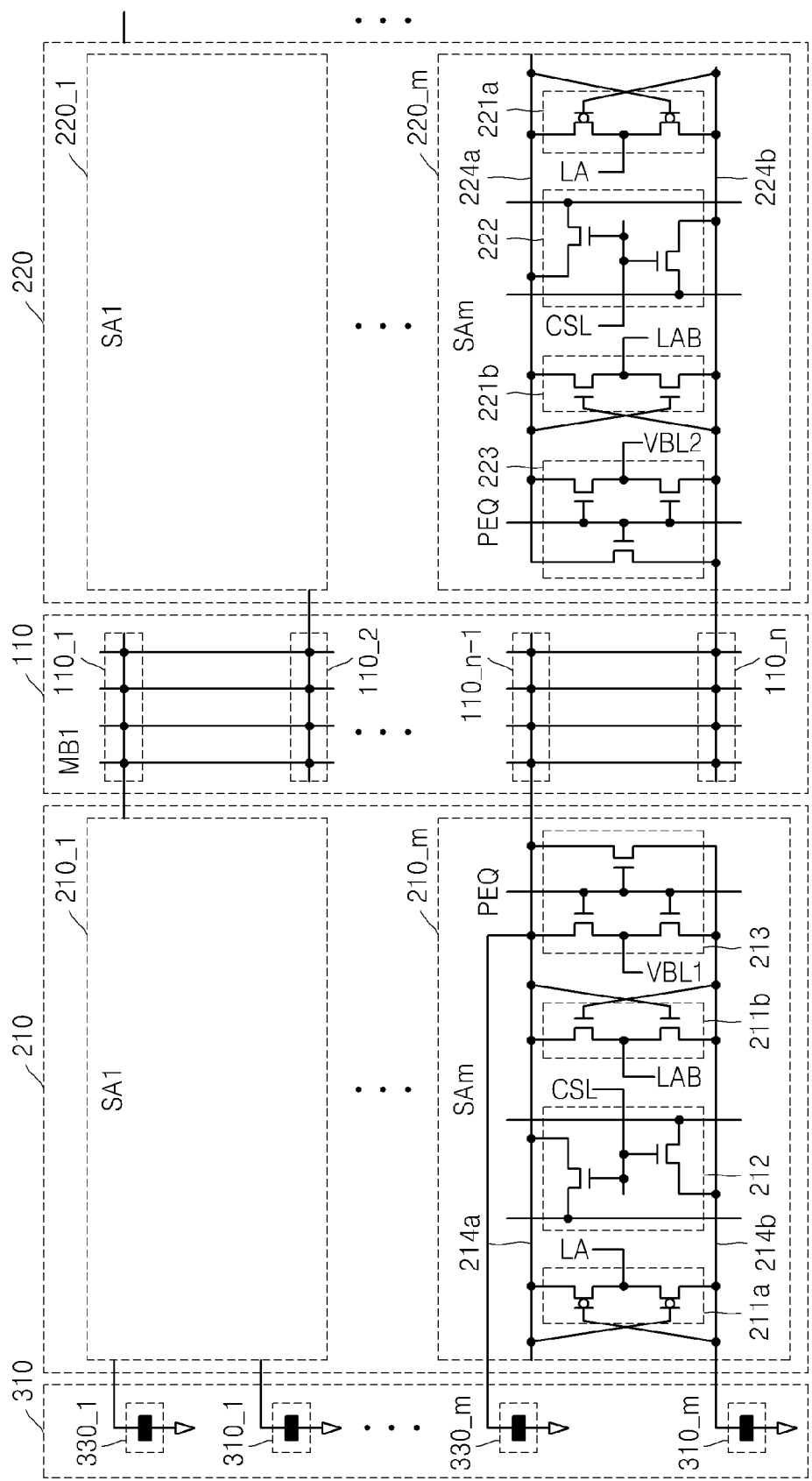
FIG. 10A is a circuit diagram of an embodiment of a semiconductor memory device including a second capacitor block connected to an equalization circuit.

FIG. 10A is a circuit diagram of an embodiment of the inventive concept showing a semiconductor memory device including a second capacitor block 330 connected to the equalization circuits 213 and 223.

When the first precharge voltage VBL1 is provided to the edge sense amplification block 210 and the second precharge voltage VBL2 is provided to the central sense amplification block 220, a capacitance electrically connected to the first precharge voltage VBL1 may be less than that electrically connected to the second precharge voltage VBL2. For example, although FIG. 10A illustrates a single central sense amplification block 220, a plurality of second sense amplification blocks (not shown) may be included in an actual array block, and the second precharge voltage VBL2 may be provided to the plurality of second sense amplification blocks. Accordingly, a capacitance imbalance may be generated between first and second equalization circuits, namely, the equalization circuits 213 and 223 receiving the first and second precharge voltages VBL1 and VBL2, respectively, and this capacitance imbalance needs to be compensated. To achieve compensation, the second capacitor block 330 connected to the edge sense amplification block 210 may be further included in the semiconductor memory device 10. The second capacitor block 330 may include a plurality of capacitors 330_1, . . . , and 330_m, wherein the number of capacitors 330_1, . . . , and 330_m may be the same as the number of SAs 210_1, . . . , and 210_m (hereinafter, referred to as first SAs) included in the edge sense amplification block 210, and each capacitor (e.g., the m-th balance capacitor 330_m) may be connected to the equalization circuit 213 of each first SA (e.g., the m-th SA 210_m).

Figure 10B:
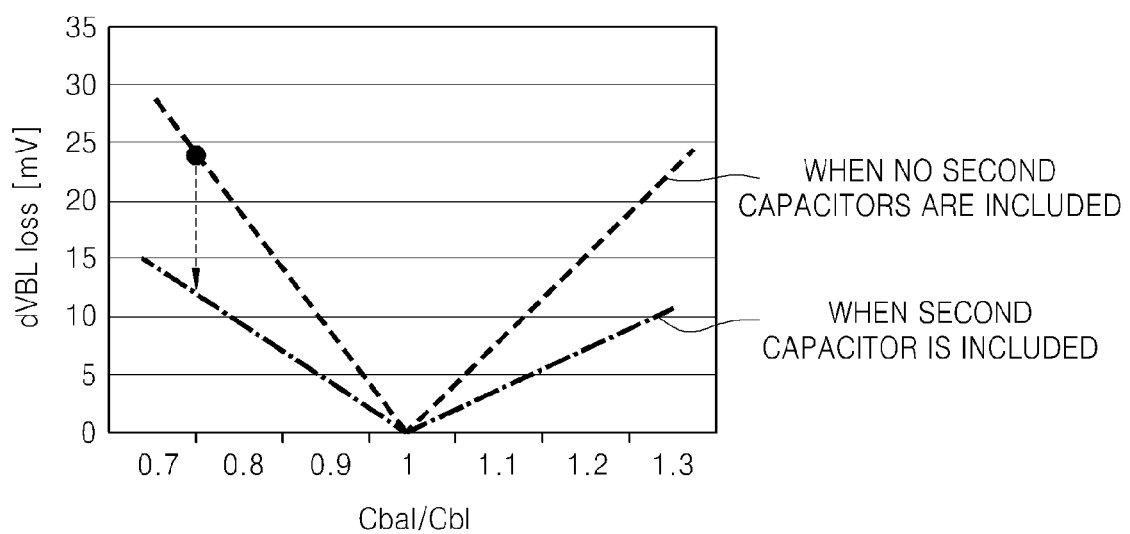
FIG. 10B is a graph illustrating the effects of the second capacitor block of FIG. 10A.

FIG. 10B is a graph showing the results obtained by this use of the second capacitor block 330 in the embodiment illustrated in FIG. 10A.

The vertical axis of FIG. 10B indicates del VBL loss, and the horizontal axis denotes a ratio of an overall capacitance Cba1 of a complementary bitline connected to a second capacitor to an overall capacitance Cb1 of a bitline not connected to the second capacitor. In the present graph, when the second capacitor is used, the angle of a V shape increases. Accordingly, when the second capacitor is used, del VBL loss generated during precharge when the overall capacitance Cba1 of the complementary bitline and the overall capacitance Cb1 of the bitline are imbalanced may be reduced.

Figure 11A:
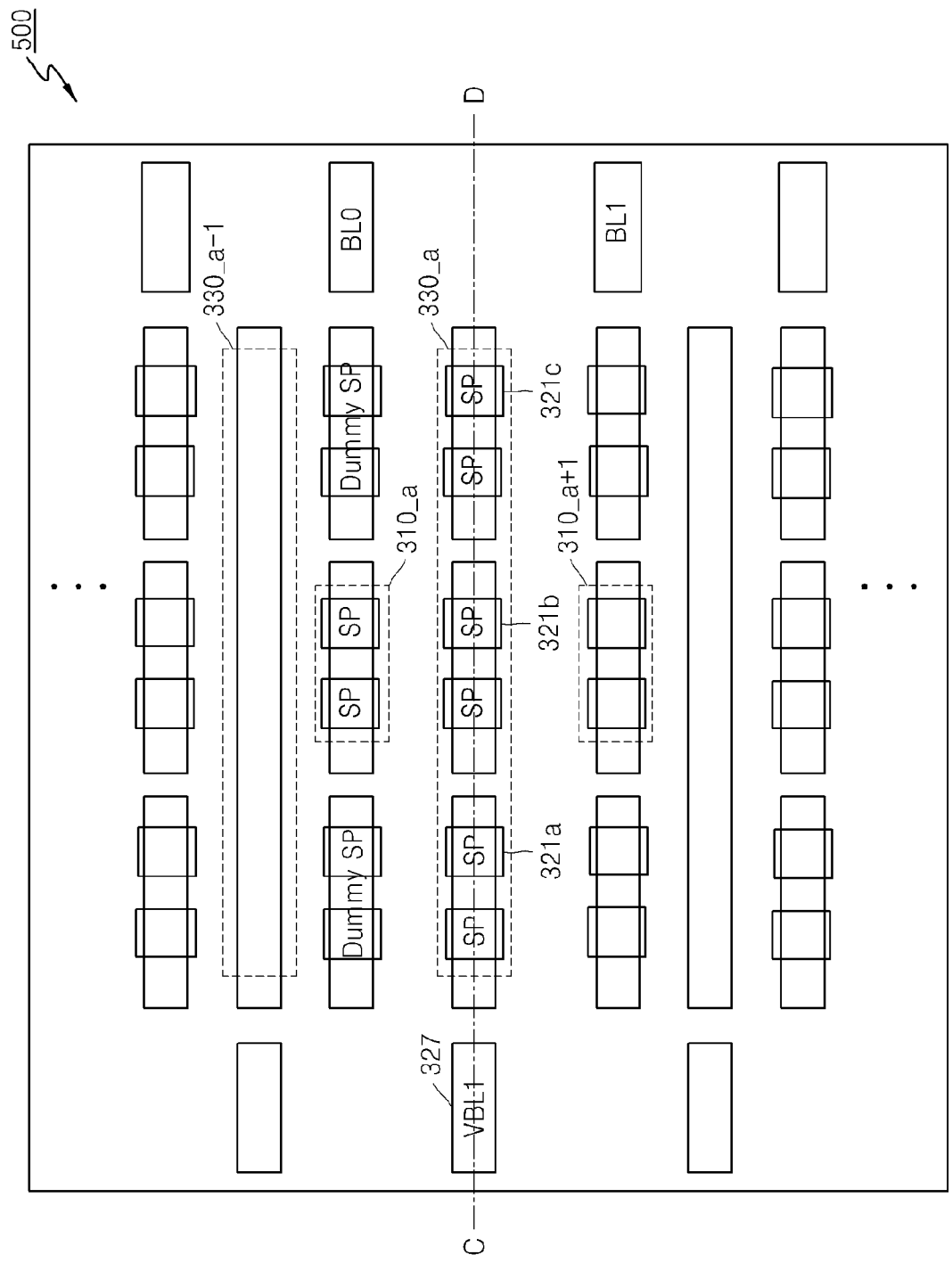
FIG. 11A is a plan view of an embodiment of a semiconductor layout of the second capacitor block.

FIG. 11A is a plan view of an embodiment of a semiconductor layout of a second capacitor block 500.

A signal line 327 for transmitting the first precharge voltage VBL1, and an a-th second capacitor 330_a are sequentially located in a direction from point C to point D. The second capacitor 330_a includes a plurality of SPs 321a, 321b, and 321c. A plurality of first capacitors and a plurality of second capacitors may alternate with each other in a direction perpendicular to a C-D direction. For example, an a-th first capacitor 310_a may be disposed between an (a-1)th second capacitor 330_a-1 and an a-th second capacitor 330_a. The a-th second capacitor 330_a may be disposed between the a-th first capacitor 310_a and an (a+1)th first capacitor 310_a+1. In other words, by alternating the second capacitors 330_a-1, 330_a, . . . , and the like with the first capacitors 310_a, 310_a+1, . . . , and the like, the area of a semiconductor layout may be prevented from increasing even when the second capacitors 330_a-1, 330_a, . . . , and the like are additionally included.

Figure 11B:
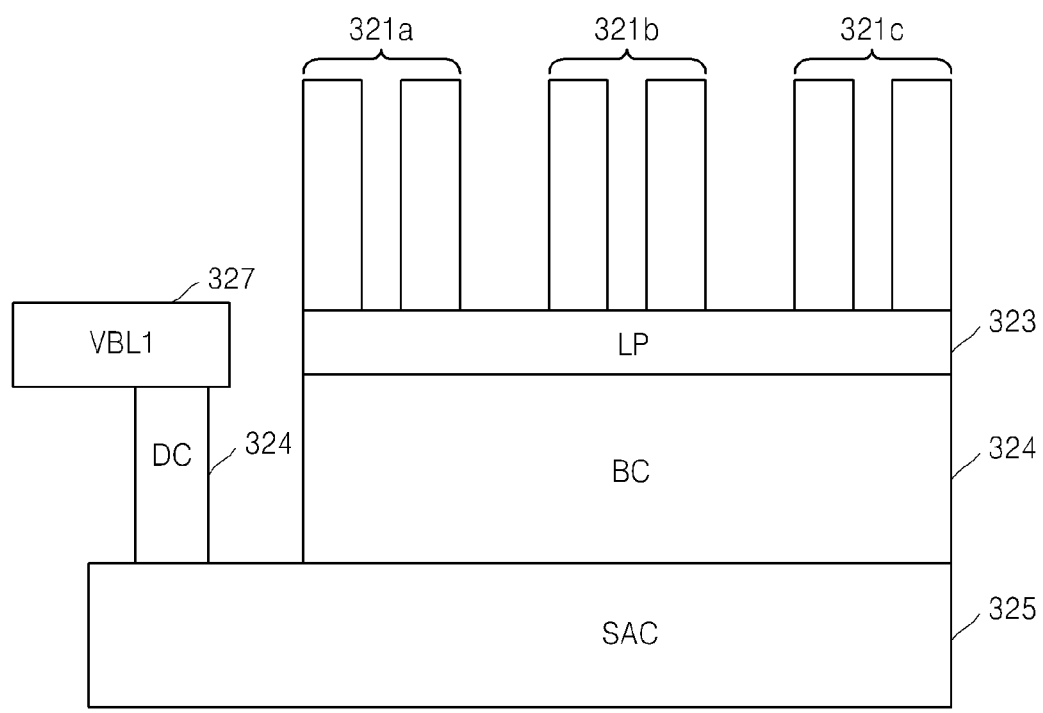
FIG. 11B is a cross-sectional view of the semiconductor layout of the second capacitor block of FIG. 11A.

FIG. 11B is a cross-sectional view of the semiconductor layout of the second capacitor block 500 of FIG. 11A.

A BC 324 is located below the signal line 327 for transmitting the first precharge voltage VBL1, and an SAC 325 is located below the DC 324. A BC 324 is located over the SAC 325, and an LP 323 is located over the BC 324. The SPs 321a, 321b, and 321c are arranged on the LP 323. The second capacitor 330_a is formed of the SPs 321a, 321b, and 321c.

Figure 12:
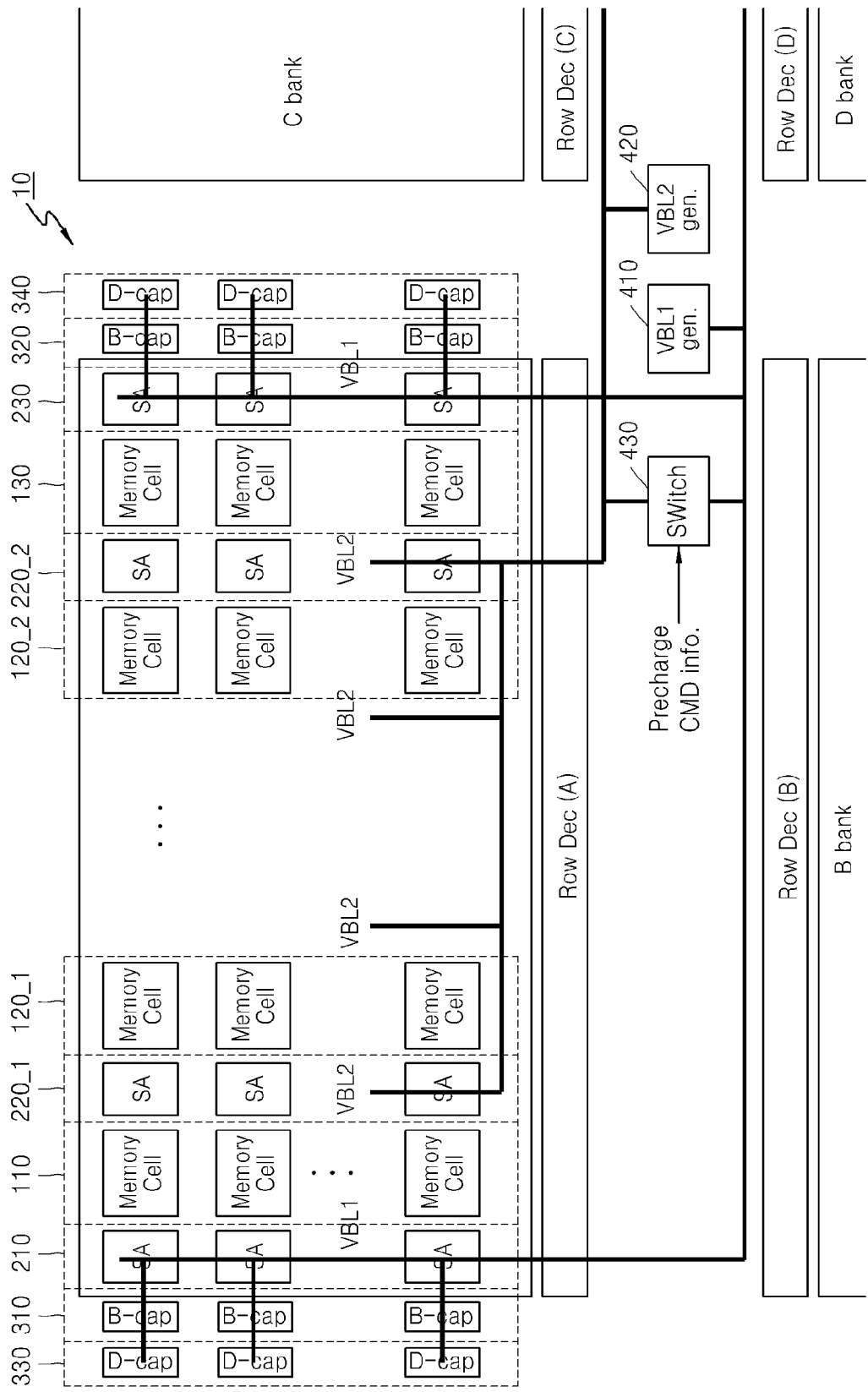
FIG. 12 is a block diagram of a semiconductor memory device including first and second precharge voltage generation units and a second capacitor block.

FIG. 12 is a block diagram of another embodiment of the inventive concept showing a semiconductor memory device 10 including the first and second precharge voltage generation units 410 and 420 and second capacitor blocks 330 and 340.

Referring to FIG. 12, the semiconductor memory device 10 includes edge memory blocks 110 and 130 respectively located proximate an edge of an array block and central memory blocks 120_1 and 120_2 located within an inner portion (non-edge) of the array block, edge sense amplification blocks 210 and 230, and central sense amplification blocks 220_1 and 220_2. First capacitor blocks 310 and 320 may be respectively connected to the edge sense amplification blocks 210 and 230 in order to achieve capacitance balance between a bitline and a complementary bitline, and the second capacitor blocks 330 and 340 may be respectively connected to the edge sense amplification blocks 210 and 230 in order to achieve capacitance balance between equalization circuits (not shown) included in the first sense amplification blocks 210 and 230 and equalization circuits (not shown) included in the second sense amplification blocks 220_1 and 220_2. The semiconductor memory device 10 may further include the first precharge voltage generation unit 410 for providing the first sense amplification blocks 210 and 230 with the first precharge voltage VBL1, the second precharge voltage generation unit 420 for providing the second sense amplification blocks 220_1 and 220_2 with the second precharge voltage VBL2, and the switch 430 for electrically connecting the first precharge voltage VBL1 to the second precharge voltage VBL2.

A plurality of capacitors included in the second capacitor blocks 330 and 340, which may be referred to as decoupling capacitors (D-Cap), are connected to SAs included in the edge sense amplification blocks 210 and 230, respectively. The capacitors included in the second capacitor blocks 330 and 340 are connected to the equalization circuits (not shown) included in the first sense amplification blocks 210 and 230. The first precharge voltage VBL1 generated by the first precharge voltage generation unit 410 is provided to the edge sense amplification blocks 210 and 230 and the second capacitor blocks 330 and 340. The switching operation of the switch 430 may be controlled according to pre-charge CMD information. For example, the switch 430 may be turned OFF for a predetermined period of time in synchronization with a precharge CMD, and may be turned ON after a precharge operation is concluded. Accordingly, the second capacitor blocks 330 and 340 are connected to the first precharge voltage generation unit 410 in response to the pre-charge CMD information, and are connected to the second precharge voltage generation unit 420 as the switch 430 is turned ON after the precharge operation.

Figure 13:
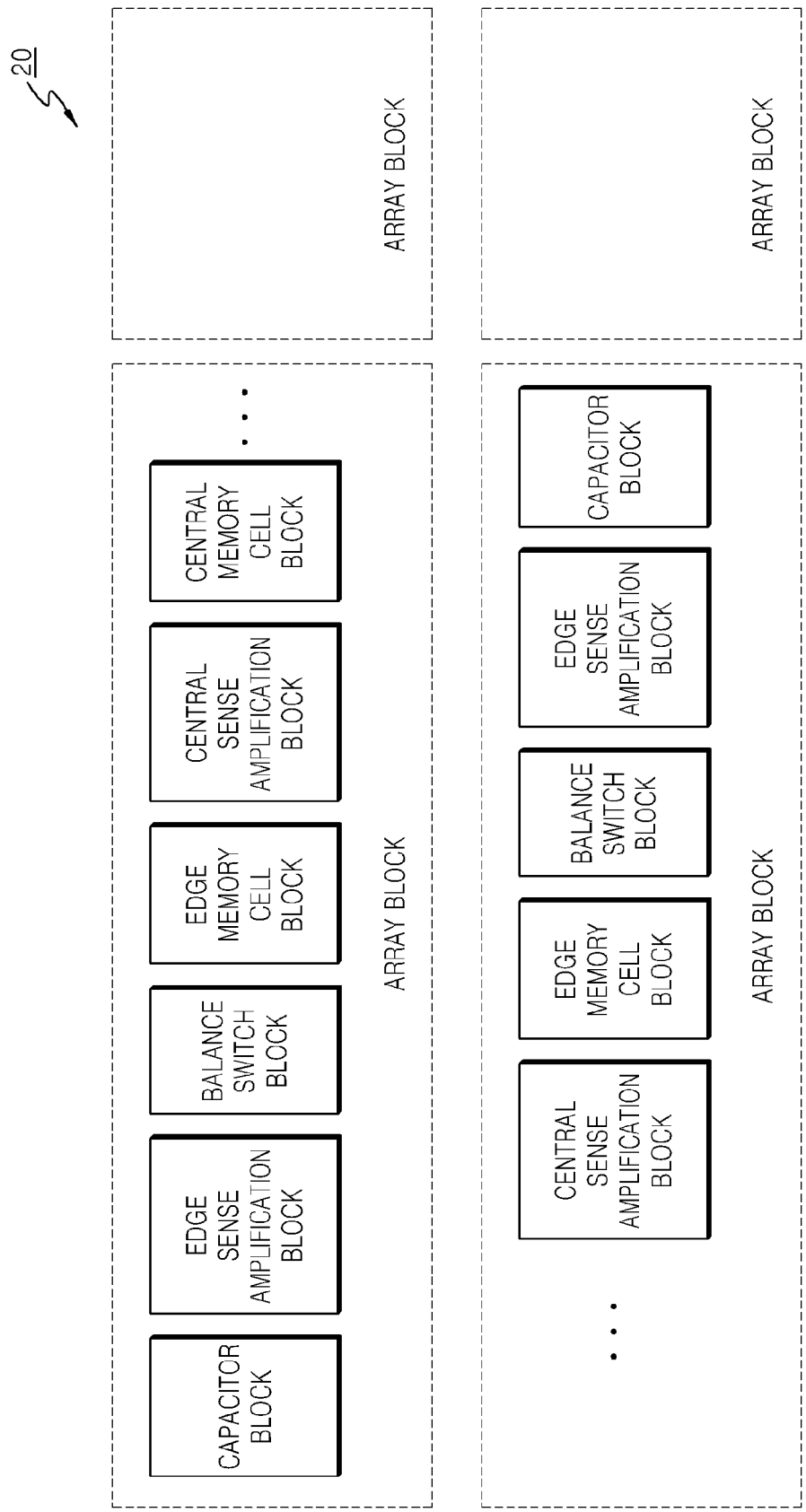
FIG. 13 is a block diagram of a semiconductor memory device according to another embodiment of the inventive concept.

FIG. 13 is a block diagram of a semiconductor memory device 20 according to another embodiment of the inventive concept. Referring to FIG. 13, the semiconductor memory device 20 comprises a plurality of array blocks. Each of the array blocks includes at least one memory block and at least one sense amplification block. The memory block may include a plurality of memory cells, and the sense amplification block may include a plurality of SAs. As before, a memory block disposed on the edge of each array block is referred to as a edge memory block, and a memory block disposed within the portion of each array block is referred to as a central memory block. Again as before, a sense amplification block disposed on the edge of each array block is referred to as a edge sense amplification block, and a sense amplification block disposed within the inner portion of each array block is referred to as a central sense amplification block.

The semiconductor memory device 20 has an open BLSA structure, and thus a dummy cell on one side of the edge sense amplification block disposed on the edge of each array block from among the sense amplification blocks included in the array block is removed. When the dummy cell is removed from the semiconductor memory device 20, a capacitance imbalance may occur between a bitline BL and a complementary bitline BLB. Accordingly, a capacitor block is arranged within the semiconductor memory device 20 in order to compensate the capacitance imbalance.

For example, a first SA included in the edge sense amplification block may be connected between a bitline and a complementary bitline, the bitline may be connected to a memory cell of the first memory block, and the complementary bitline may be connected to a capacitor included in the capacitor block. It is desirable that the capacitance value of the capacitor connected to the complementary bitline is equal to the amount of capacitance applied to the bitline due to the memory cell. However, it is difficult to exactly equalize the capacitance value of the capacitor to the amount of capacitance applied to the bitline, during a semiconductor process. Accordingly, when capacitance imbalance occurs between the bitline and the complementary bitline, the performance of the precharge operation degrades.

According to the certain embodiments of the inventive concept, a balance switch block is included in each array block in order to reduce the degradation of the performance of the precharge operation. The balance switch block electrically connects either a first bitline or a first complementary bitline to either a second bitline or a second complementary bitline. The balance switch block may electrically connect either the first bitline or the first complementary bitline to either the second bitline or the second complementary bitline, after a predetermined period of time after a precharge operation for bitlines starts. When the first bitline and the first complementary bitline are connected to the first SA located on the edge of each memory array, the first bitline and the first complementary bitline may not exactly reach a precharge voltage due to capacitance imbalance therebetween during the precharge operation. On the other hand, when the second bitline and the second complementary bitline are connected to the second SA located on the inner side of each memory array, the second bitline and the second complementary bitline reach a voltage that is the same as or almost similar to the precharge voltage during the precharge operation. Due to the inclusion of the balance switch block, the voltages of the second bitline and the second complementary bitline affect the voltages of the first bitline and the first complementary bitline, so that the voltages of the first bitline and the first complementary bitline are close to the precharge voltage.

As illustrated in FIG. 13, two edge sense amplification blocks are included in each array block so as to be arranged on both edges of the array block. Two edge memory blocks may also be included in each array block so as to be arranged on both edges of the array block. In this case, the balance switch block may be arranged to correspond to each of the two edge sense amplification blocks.

Figure 14:
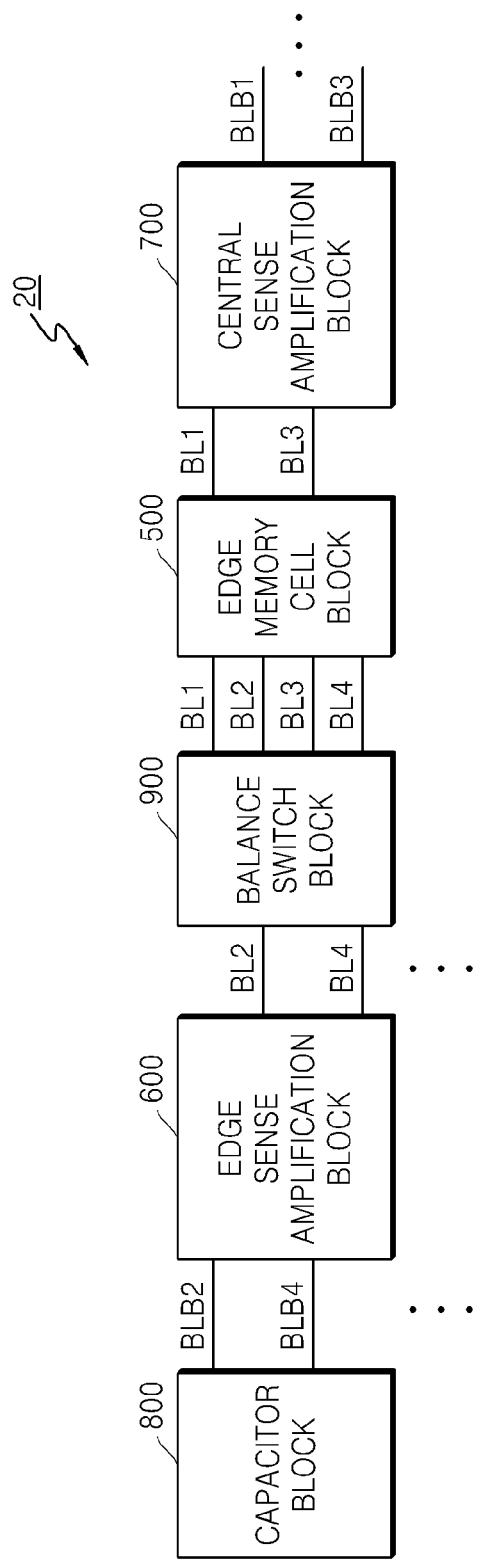
FIG. 14 is a block diagram further illustrating the memory array included in the semiconductor memory device of FIG. 13.

A more detailed structure of the semiconductor memory device 20 of FIG. 13 will now be described with reference to FIG. 14. FIG. 14 is a block diagram of a single array block included in the semiconductor memory device 20 of FIG. 13.

Referring to FIG. 14, an edge sense amplification block 600 is disposed on the edge of the array block of the semiconductor memory device 20, and includes at least one first SA (not shown). One of the first SAs senses a voltage difference between a bitline BL2 and a complementary bitline BLB2, and another first SA senses a voltage difference between a bitline BL4 and a complementary bitline BLB4. The bitlines BL2 and BL4 are connected to memory cells included in a first memory block 500 (shown as 100), and the complementary bitlines BLB2 and BLB4 are connected to capacitors included in a capacitor block 800.

A central sense amplification block 700 is disposed on the inner side of the array block and includes at least one second SA (not shown). Each second SA may be connected between a predetermined bitline and a predetermined complementary bitline. For example, a bitline BL1 connected to the second SA may be connected to the memory cells included in the first memory block 500, and a complementary bitline BLB1 may be connected to memory cells included in a central memory block (not shown) located on the inner side of the array block. The value of a capacitance applied to the bitline BL2 due to the memory cells included in the first memory block 500 should be equal to the value of a capacitance of a capacitor included in the capacitor block 800, but a difference between the values of the capacitance applied to the bitline BL2 and the capacitance of the capacitor included in the capacitor block 800 may be generated due to an error that may be generated during a semiconductor process. However, since the bitline BL1 and the complementary bitline BLB1 are connected to the memory cells of the first memory block 500 and the second memory block, respectively, which are formed by the same process, the values of capacitances applied to the bitline BL1 and the complementary bitline BLB1 are the same as or similar to each other.

A balance switch block 900 may include a plurality of balance switches (not shown). Each of the balance switches electrically connects either a bitline or a complementary bitline that are connected to the first SA to either a bitline or a complementary bitline that are connected to the second SA. For example, each balance switch is turned ON in response to a predetermined control signal (for example, a balance control signal), to electrically connect the second bitline BL2 connected to the first SA to the first bitline BL1 connected to the second SA.

During the precharge operation of the semiconductor memory device 20, the bitlines within the array block are precharged with the precharge voltage. Since an error may be generated to the values of the capacitances applied to the second bitline BL2 and the second complementary bitline BLB2 connected to the first SA, such capacitance imbalance affects a precharge time, and an error is generated between a voltage level of the bitline and the complementary bitline connected to the first SA according to the precharge operation and the precharge voltage. Accordingly, a predetermined period of time after the precharge operation, the error between the voltage level of the second bitline BL2 and the second complementary bitline BLB2 and the precharge voltage is relatively large, whereas the error between the voltage level of the first bitline BL1 and the first complementary bitline BLB 1 and the precharge voltage is relatively small. A switch of the balance switch block 900 is turned ON after a predetermined period of time in order to electrically connect the second bitline BL2 with the first bitline BL1 and to allow a voltage applied to the first bitline BL1 to affect the voltage level of the second bitline BL2. Accordingly, the voltage level of the second bitline BL2 approximates to the precharge voltage, and the voltage level of the second complementary bitline BLB2 electrically connected to the second bitline BL2 also approximates to the precharge voltage.

Figure 15:
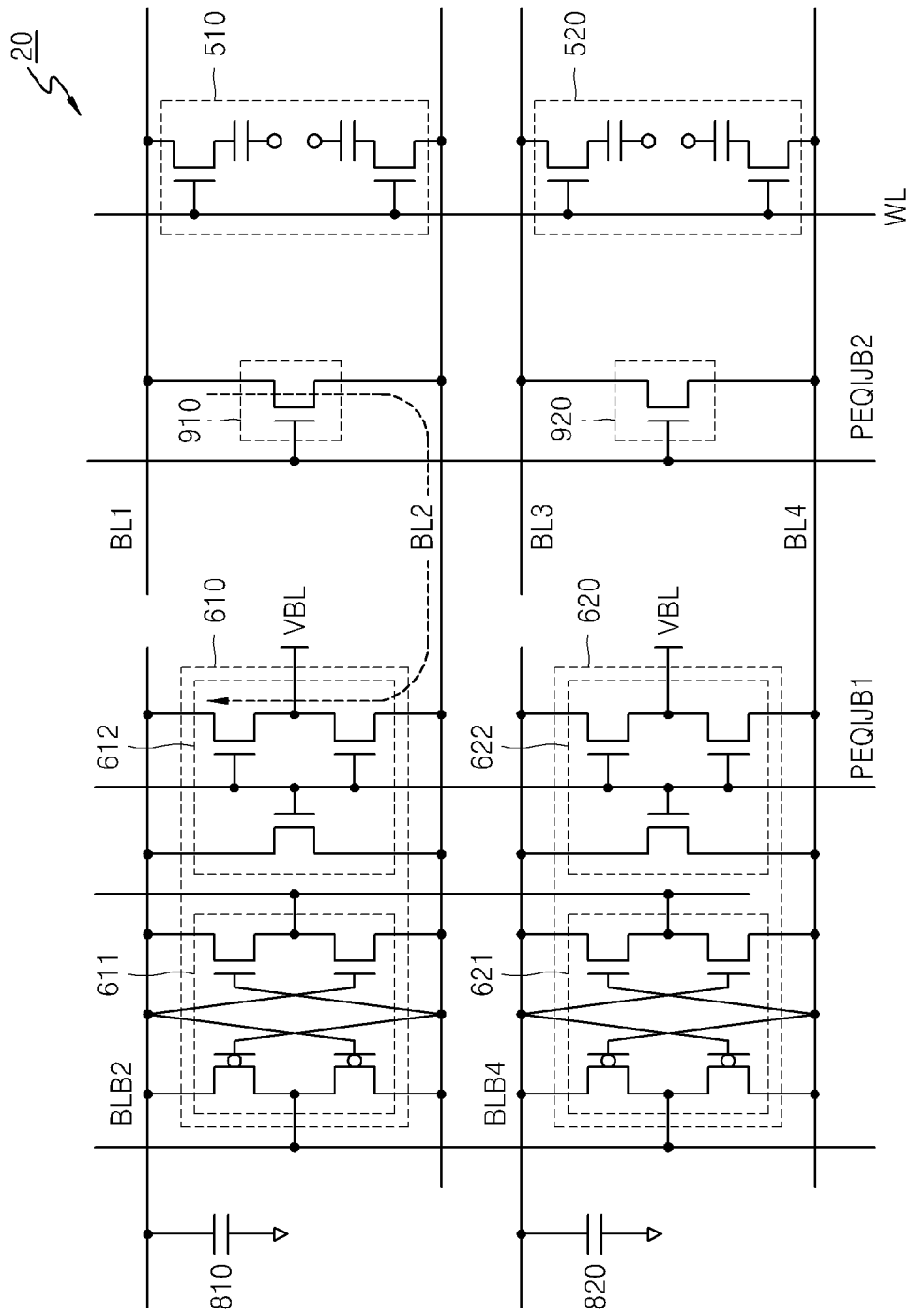
FIG. 15 is a circuit diagram further illustrating in one embodiment the semiconductor memory device of FIG. 14.

FIG. 15 is a circuit diagram further illustrating the embodiment of the semiconductor memory device 20 of FIG. 14. An exemplary operation of the semiconductor memory device 20, according to an embodiment of the inventive concept, will now be described with reference to FIGS. 14 and 15.

The edge memory block 500 includes a plurality of memory cells 510, 520, ..., and the like, and the edge sense amplification block 600 includes a plurality of first SAs 610, 620, ..., and the like in order to perform data writing/reading with respect to the memory cells 510, 520, ..., and the like. The first SAs 610, 620, ..., and the like may include amplification circuits 611, 621, ..., and the like, respectively, for sensing a voltage difference between bitlines and complementary bitlines, and precharge circuits 612, 622, ..., and the like, respectively, for precharging the bitlines and the complementary bitlines. Referring to FIG. 15, the first SA 610 is connected between a second bitline BL2 and a second complementary bitline BLB2, and includes the amplification circuit 611 and the precharge circuit 612. The precharge circuit 612 includes at least one transistor and provides a precharge voltage VBL to the second bitline BL2 and the second complementary bitline BLB2 in response to a precharge control signal PEQIJB1 so as to precharge the second bitline BL2 and the second complementary bitline BLB2 with the precharge voltage VBL.

The first SAs 610, 620, ..., and the like are connected to a plurality of capacitors 810, 820, ..., and the like, respectively, included in the capacitor block 800. A bitline or a complementary bitline which are connected to each first SA is connected to a capacitor of the capacitor block 800. For example, the capacitor 810 is connected to an end of the complementary bitline BLB2 which is connected to the first SA 610. The first SA 610 senses a voltage difference between the second bitline BL2 and the second complementary bitline BLB2 and reads data from the memory cell 510.

As described above, the balance switch block 900 includes a plurality of balance switches 910, 920, ..., and the like, and the balance switches 910, 920, ..., and the like are arranged to correspond to the first SAs 610, 620, ..., and the like, respectively. For example, the balance switch 910 is disposed to correspond to the first SA 610. The balance switches 910, 920, ..., and the like may be MOS transistors, and are switched in response to a balance control signal PEQIJB2. For example, the balance switch 910 is turned on in response to the predetermined control signal PEQIJB2 and electrically connects the first bitline BL1 to the second bitline BL2. In other words, the first SA 610 senses a voltage difference between the second bitline BL2 and the second complementary bitline BLB2, a second SA (not shown) adjacent to the first SA 610 senses a voltage difference between the first bitline BL1 and the first complementary bitline BLB1, and the balance switch 910 connects a bitline connected to the first sense amplifier 610 to a bitline connected to the second SA. Accordingly, during a precharge operation with respect to bitlines, the voltages of the second bitline BL2 and the second complementary bitline BLB2 are changed according to the voltages applied to the first bitline BL1 and the first complementary bitline BLB 1.

The bitlines in the array block are precharged in response to the precharge control signal PEQIJB 1. Accordingly, to make the voltage levels of the bitlines connected to the first SAs 610, 620, ..., and the like according to the precharge operation approximate to the precharge voltage VBL, the balance control signal PEQIJB2 for controlling the balance switch block 900 may be synchronized with the precharge control signal PEQIJB 1. For example, when a predetermined period of time lapses after the precharge operation is performed, an error exists between the voltage level of the bitlines connected to the first SAs 610, 620, ..., and the like and the precharge voltage VBL, whereas the voltage level of the bitlines connected to the second SAs (not shown) and the precharge voltage VBL are equal to each other or have a relatively small error therebetween. As described above, after the voltage level of the bitlines connected to the second SAs (not shown) is stabilized after the lapse of the predetermined period of time, the bitlines connected to the first SAs 610, 620, ..., and the like are connected to the bitlines connected to second SAs (not shown), respectively. To achieve this, the balance control signal PEQIJB2 for controlling the balance switch 510 may have a phase obtained by delaying the precharge control signal PEQIJB 1 for a predetermined period of time.

Referring to FIGS. 14 and 15, the balance switch block 900 and the edge sense amplification block 600 are separate components. However, the present inventive concept is not limited thereto, and the edge sense amplification block 600 may include balance switches. In other words, the first SA 610 included in the edge sense amplification block 600 may include the balance switch 910 in addition to the amplification circuit 611 and the precharge unit 612. The balance switch 910 included in the edge sense amplifier 610 may be electrically connected to one bitline connected to the second SA (not shown) adjacent to the first SA 610.

Figure 16A:
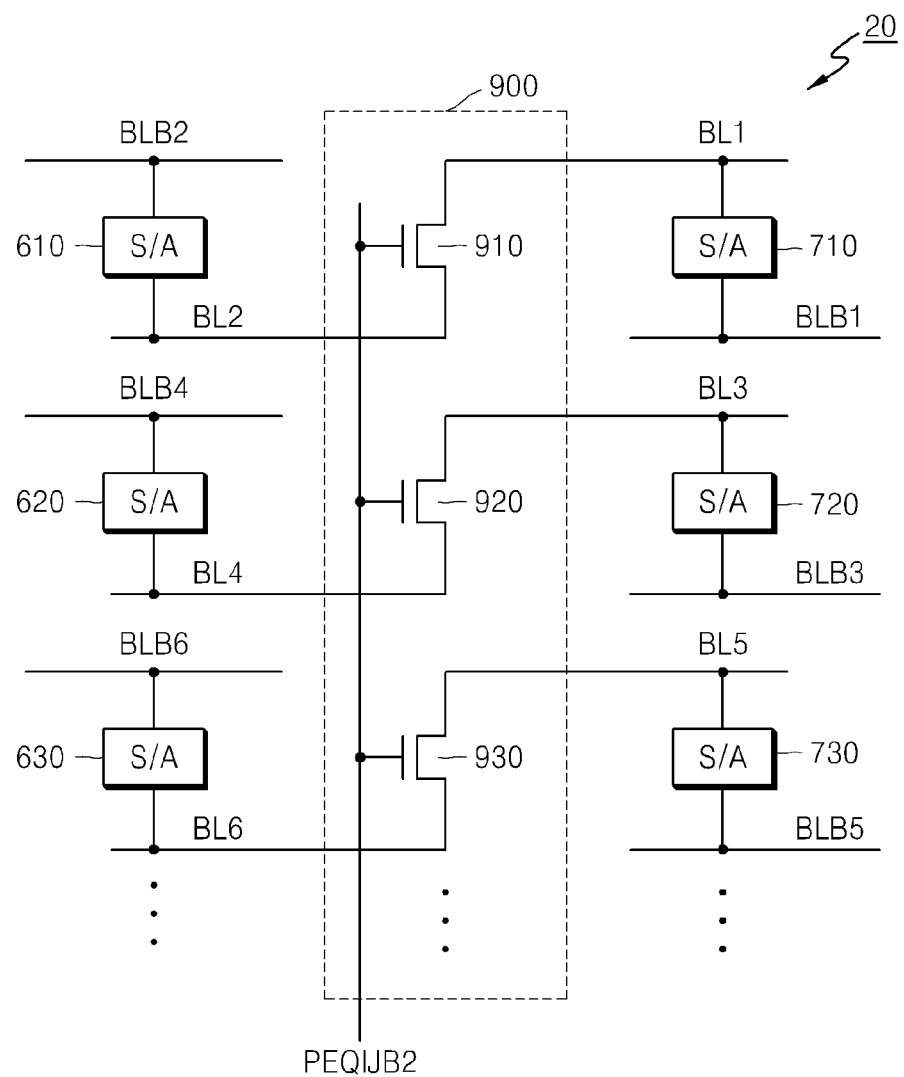
FIGS. 16A, 16B, and 16C are circuit diagrams of embodiments of a balance switch block included in the semiconductor memory device of FIG. 14.
Figure 16B:
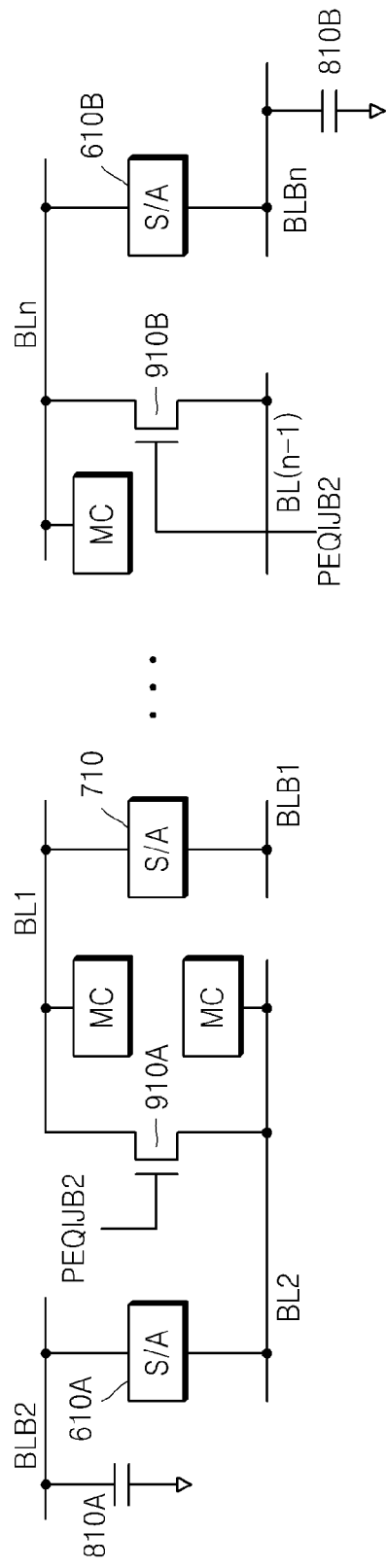
Figure 16C:
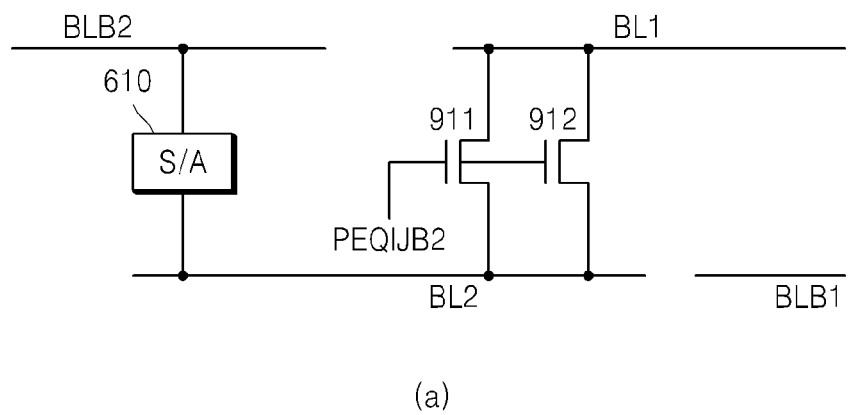
Figure 16C:
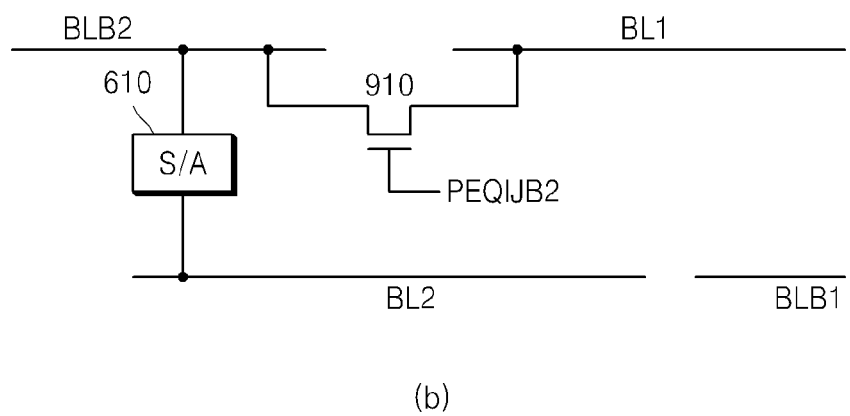

FIGS. 16A, 16B, and 16C are circuit diagrams further illustrating certain embodiments of the balance switch block 900. Referring to FIG. 16A, the first sense amplification block 600 includes a plurality of first SAs 610, 620, 630, ..., and the like, and the central sense amplification block 700 includes a plurality of second SAs 710, 720, 730, ..., and the like. A plurality of balance switches 910, 920, ..., are included in the balance switch block 900 to correspond to the first SAs 610, 620, 630, ..., and the like, respectively, and the second SAs 710, 720, 730, ..., and the like, respectively.

The first SA 610 is connected between the second bitline BL2 and the second complementary bitline BLB2, the first SA 620 is connected between the fourth bitline BL4 and the fourth complementary bitline BLB4, and the first SA 630 is connected between the sixth bitline BL6 and the sixth complementary bitline BLB6. The second SA 710 is connected between the first bitline BL1 and the first complementary bitline BLB 1, the second SA 720 is connected between the third bitline BL3 and the third complementary bitline BLB3, and the second SA 730 is connected between the fifth bitline BL5 and the fifth complementary bitline BLB5. A voltage level obtained a predetermined period of time after precharging the bitline pairs BL2-BLB2, BL4-BLB4, and BL6-BLB6 connected to the first SAs 610, 620, and 630 may be different from the level of the precharge voltage VBL. When the balance control signal PEQIJB2 is activated, the first bitline BL1 and the second bitline BL2 are electrically connected to each other. Also, the third bitline BL3 and the fourth bitline BL4 are electrically connected to each other, and the fifth bitline BL5 and the sixth bitline BL6 are electrically connected to each other. The voltage levels of the first, third, and fifth bitlines BL1, BL3, and BL5 affect the bitline pairs BL2-BLB2, BL4-BLB4, and BL6-BLB6 connected to the first SAs 610, 620, and 630, and thus the voltage levels of the bitline pairs BL2-BLB2, BL4-BLB4, and BL6-BLB6 approximate to the level of the precharge voltage VBL. Accordingly, the time taken to precharge the bitlines connected to the edge sense amplification block 600 may be reduced, and memory operation performance may be improved by making a voltage level of the bitlines obtained by the precharge operation approximate to the precharge voltage VBL.

FIG. 16B illustrates a case where a edge sense amplification block is arranged on either side of an array block. A first SA 610A located on the left edge of the array block, and a first SA 610B located on the right edge of the array block may be included in the array block. Referring to FIG. 16B, the first SA 610A is connected between a second bitline BL2 and a second complementary bitline BLB2, and the first SA 610B is connected between an n-th bitline BLn and an n-th complementary bitline BLBn. The second bitline BL2 is connected to a memory cell (MC), and the second complementary bitline BLB2 is connected to a capacitor 810A. The n-th bitline BLn is connected to a MC, and the n-th complementary bitline BLBn is connected to a capacitor 810B.

In order to improve the performance of a precharge operation of the bitlines connected to the first SAs 610A and 610B located on the edges, balance switches may also be arranged to correspond to the first SAs 610A and 610B located on both edges of the array block, respectively. For example, a balance switch 910A may be disposed to correspond to the first SA 610A, and a balance switch 910B may be disposed to correspond to the first SA 610B. The balance switches 910A and 910B may be commonly controlled according to the balance control signal PEQIJB2. When the balance switch 910A is turned ON, the voltage level of the first bitline BL1 and the first complementary bitline BLB1 affects the voltage level of the second bitline BL2 and the second complementary bitline BLB2. When the balance switch 910B is turned ON, the voltage level of the (n−1)th BL(n−1) and the (n−1)th complementary bitline BLB(n−1) affects the voltage level of the n-th bitline BLn and the n-th complementary bitline BLBn.

FIG. 16C, inclusive of FIGS. 16C(a) and 16C(b), is a circuit diagram of various embodiments of connection between balance switches and bitlines. As illustrated in FIG. 16C(a), the second bitline BL2 or the second complementary bitline BLB2 which are connected to the first SA 610 located on the edge may be connected to one bitline of a bitline pair adjacent to the second bitline BL2 and the second complementary bitline BLB2 (for example, a first bitline pair BL1-BLB1). To achieve this connection, two or more balance switches 911 and 912 may be arranged, and the balance switches 911 and 912 may be connected parallel to each other between the bitlines. For example, although FIG. 16C illustrates that the two balance switches 911 and 912c are arranged between the second bitline BL2 and the first bitline BL1, the number of balance switches arranged may be more than 2.

As illustrated in FIG. 16C(b), the second complementary bitline BLB2 may be connected to one bitline of the first bitline pair BL1-BLB1. For example, FIG. 16C(b) illustrates an example in which the second complementary bitline BLB2 is connected to the first bitline BL1. Although FIG. 16C(b) illustrates only one balance switch 910, two or more balance switches may be disposed as illustrated in FIG. 16C (a). The balance switch 910 may be connected between the second complementary bitline BLB2 and the first complementary bitline BLB1. Although not illustrated, balance switches may be arranged by combining the embodiments of FIGS. 16C(a) and 16C(b) with each other. For example, a balance switch may be arranged between the first bitline BL1 and the second bitline BL2, and at the same time a balance switch may be further arranged between the first complementary bitline BLB 1 and the second complementary bitline BLB2.

Figure 17A:
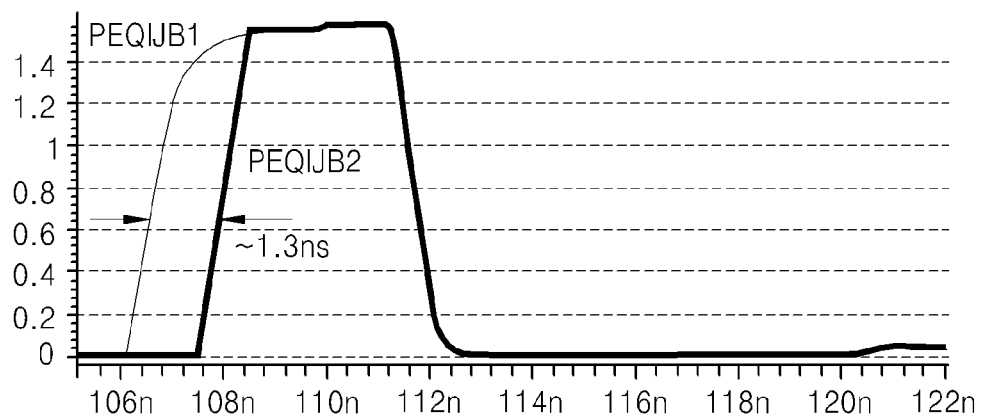
FIGS. 17A and 17B are waveform diagrams of control signals and the voltage levels of bitlines.
Figure 17B:
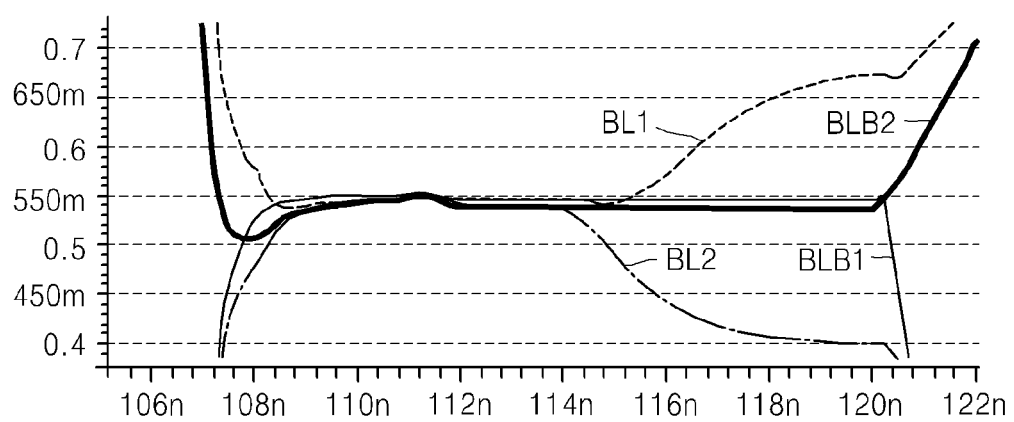

FIGS. 17A and 17B are waveforms of control signals and the voltage levels of bitlines. As illustrated in FIGS. 17A and 17B, the precharge control signal PEQIJB1 for precharging the bitlines of a memory array and the balance control signal PEQIJB2 for turning on a balance switch may have a predetermined phase difference. Since it is desirable that the balance control signal PEQIJB2 is activated after the bitlines connected to a second SA stably reaches a precharge voltage level, the balance control signal PEQIJB2 may be activated a predetermined period of time after the precharge control signal PEQIJB 1 is activated. The duration of the precharge operation may generally correspond to several tens of nanoseconds (ns). In FIG. 17A, the balance control signal PEQIJB2 is activated 1.3 ns after the precharge control signal PEQIJB1 is activated.

FIG. 17B illustrates a variation of the voltage levels of the second bitline BL2 and the second complementary bitline BLB2 connected to the first SA. When no balance switches are included, an error may be generated between the voltage levels of the second bitline BL2 and the second complementary bitline BLB2 and the precharge voltage VBL after a predetermined period of time after the precharge operation. Thus, the time required to perform the precharge operation increases. On the other hand, when a balance switch is included, the voltage of the first bitline BL1 and the first complementary bitline BLB1 affects the second bitline BL2 and the second complementary bitline BLB2 as the balance control signal PEQIJB2 is activated, so that the voltage level of the second bitline BL2 and the second complementary bitline BLB2 approximates to the precharge voltage VBL within a shorter period of time.

While the inventive concept has been particularly shown and described with reference to exemplary embodiments thereof, it will be understood that various changes in form and details may be made therein without departing from the scope of the following claims.

What is claimed is:

1. A semiconductor memory device having an open bitline memory structure, comprising:
    an edge sense amplification block comprising a first sense amplifier connected to a first memory cell arrangement of an edge memory block, the first sense amplifier comprising a first equalization circuit connected to a first power signal;
    a central sense amplification block comprising a second sense amplifier connected to a second memory cell arrangement of the edge memory block, the second sense amplifier comprising a second equalization circuit connected to a second power signal; and
    a power generation device that generates the first power signal and the second power signal, wherein the first power signal is provided to the first equalization circuit through a different signal path than the second power signal is provided to the second equalization circuit.

2. The semiconductor memory device of claim 1, further comprising:
    a first capacitor block electrically connected to the edge sense amplification block and comprising a first capacitor, wherein the first sense amplifier comprises a first bitline connected to the first memory cell arrangement and a first complementary bitline connected to the first capacitor.

3. The semiconductor memory device of claim 2, further comprising:
a second capacitor block comprising a second capacitor connected to the first equalization circuit.

4. The semiconductor memory device of claim 3, wherein the second capacitor is disposed at a level below a level at which the first capacitor is disposed on a semiconductor substrate of the semiconductor memory device.

5. The semiconductor memory device of claim 3, wherein the second capacitor is connected to the first power signal.

6. The semiconductor memory device of claim 5, wherein the power generation device comprises a driver unit that drives the first power signal, and the driver unit is arranged to correspond to the first sense amplifier.

7. The semiconductor memory device of claim 1, wherein the power generating device comprises a first power generating device that generates the first power signal, and a second power generating device that generates the second power signal.

8. The semiconductor memory device of claim 3, further comprising:
a switch connected between the first power generating device and the second power generating device.

9. The semiconductor memory device of claim 8, wherein the switch is controlled in response to a precharge command.

10. The semiconductor memory device of claim 7, wherein the first and second power generating devices respectively comprises a reference unit, a comparator, and a driver unit.

11. The semiconductor memory device of claim 10, wherein the first power generating device further comprises a switch operating in response to a precharge command.

* * * * *